(12) United States Patent
Ito et al.

(10) Patent No.: US 7,248,188 B2
(45) Date of Patent: Jul. 24, 2007

(54) ENCODER AND DECODER

(75) Inventors: Toshio Ito, Kawasaki (JP); Masaru Sawada, Kawasaki (JP); Toshihiko Morita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/377,124

(22) Filed: Mar. 16, 2006

(65) Prior Publication Data

US 2006/0220928 A1 Oct. 5, 2006

Related U.S. Application Data

(63) Continuation-in-part of application No. 11/201,895, filed on Aug. 11, 2005, now abandoned.

(30) Foreign Application Priority Data

Mar. 31, 2005 (JP) ............................. 2005-102093
Nov. 28, 2005 (JP) ............................. 2005-342666

(51) Int. Cl.
*H03M 7/00* (2006.01)
(52) U.S. Cl. .................... 341/58; 341/59; 369/59.21
(58) Field of Classification Search ............... 341/58, 341/59, 68, 69; 360/41, 48; 369/59.21, 369/59.22, 59.23
See application file for complete search history.

(56) References Cited

U.S. PATENT DOCUMENTS 6,778,105 B2 * 8/2004 Suh et al. .................. 341/59
6,829,306 B2 * 12/2004 Immink et al. ............ 375/253
6,853,320 B2 * 2/2005 Hayami et al. ............ 341/68
7,006,016 B1 * 2/2006 Feng ......................... 341/58

FOREIGN PATENT DOCUMENTS

DE 35 10724 9/1985
EP 1 047 197 10/2000
WO WO 03/007300 1/2003

OTHER PUBLICATIONS

Kees A. Schouhamer Immink; "Codes for Mass Data Storage Systems"; Shannon Foundation Publishers, Nov. 2004; pp. 185-278.
Ivan J. Fair et al.; Guided Scrambling: A New Line Coding Technique for High Bit Rate Fiber Optic Transmission Systems; IEEE Trans. on Comm., vol. 39, No. 2, Feb. 1991; pp. 289-291.
Zhai et al; "Performance Evaluation of DC-Free Error-Control Block Codes"; Communications Systems, 2004; ICCS 2004; The $9^{th}$ Int'l. Conference on Singapore, China; Sep. 6-8, 2004; Piscataway, NJ, IEEE, Sep. 6, 2004, pp. 451-455.
Xin et al.; "Low-Frequency Performance of Guided Scrambling DC-Free Codes"; IEEE Communications Letters, IEEE Service Center, Piscataway, NJ, vol. 9, No. 6; Jun. 2005, pp. 537-539.
Immink et al.; "Codes for Digital Recorders"; IEEE Trans. on Information Theory, vol. 44, No. 6; Oct. 1998; pp. 2260-2299.

* cited by examiner

*Primary Examiner*—Howard Williams
(74) *Attorney, Agent, or Firm*—Greer, Burns & Crain, Ltd.

(57) ABSTRACT

An encoded-bit-string generating unit generates a bit string encoded by scrambling an input bit string. A direct-current-component evaluating unit selects a bit string having a predetermined width in the bit string generated by the encoded-bit-string generating unit, while shifting bits one by one, and evaluates the direct-current component in the selected bit string. A bit-string extracting unit extracts a bit string with suppressed direct-current component, based on a result of an evaluation by the direct-current-component evaluating unit.

21 Claims, 31 Drawing Sheets

| NUMBER OF SHIFTS | REVERSING CRITERION FOR BLOCK A | REVERSING CRITERION FOR BLOCK B |
|---|---|---|
| 0 | d,0,c,d,0 | c,d,0,c,d |
| 1 | c,d,0,c,d | 0,c,d,0,c |
| 2 | 0,c,d,0,c | d,0,c,d,0 |
| 3 | d,0,c,d,0 | c,d,0,c,d |
| 4 | c,d,0,c,d | 0,c,d,0,c |
| 5 | 0,c,d,0,c | d,0,c,d,0 |
| . | . | . |
| . | . | . |
| . | . | . |

```
        ┌─────┬───────────────────────┐
        │ 1 1 0│0 1 1 1 1 1 0 0 0 0 1 · · · 0 1│
        └─────┴───────────────────────┘
              ┌─────┬───────────────────────┐
    +         │ 1 1 0│0 1 1 1 1 1 1 0 · · · 0 0 0 0 1│
              └─────┴───────────────────────┘
─────────────────────────────────────────────
SAMPLE OUTPUT  1 0 1 1 0 0 0 1 1 1      · · · 0 1
```

ENCODER AND DECODER

This is a continuation-in-part of application Ser. No. 11/201,895, filed Aug. 11, 2005 now abandoned.

BACKGROUND OF THE INVENTION

1. Field of the Invention

The present invention relates to a technology for encoding and decoding a bit string, realizing a decrease of an error rate even with a high code rate, while reducing a circuit size.

2. Description of the Related Art

Conventionally, a recording method for recording data in a memory unit such as a magnetic disk and a magneto-optical disk includes a longitudinal recording method in which a magnetic field is applied along a magnetic disk surface, and a perpendicular recording method in which a magnetic field is applied perpendicularly to a magnetic recording surface.

The perpendicular recording method has more resistance to a thermal fluctuation than the longitudinal recording method, and can increase the surface recording density. Accordingly, storage devices using the perpendicular recording method have been actively produced recently.

In the longitudinal recording method, the waveform of a recording and reproduction signal is a pulse wave, while in the perpendicular recording method, the waveform of the recording and reproduction signal is a rectangular wave.

However, since a preamplifier that performs recording and reproduction of information on the magnetic recording surface via a magnetic head has a high-pass filter characteristic, a low frequency domain of the signal is intercepted to cause a distortion in the waveform of the rectangular wave, thereby causing a problem in that an error rate in recording and reproduction of the signal may be deteriorated.

To solve this problem, a base line correction processing provided on a read channel (for example, a read channel shown in FIG. 1) may be used, or an encoder and a decoder that suppresses direct-current (DC) components in the rectangular wave signal need to be used. For example, there are an encoder and a decoder using a DC-free run-length-limited (RLL) encoding method, which have already been installed in the storage unit such as the magnetic disk and the magneto-optical disk (see, for example, K. A. Schouhamer Immink, "Codes for Mass Data Storage Systems", The Netherlands, Shannon Foundation Publishers, November 2004).

The DC-free RLL encoding method has a function of suppressing the DC components in the signal. In an RLL code, in a bit string, the smallest number and the largest number of continuous "0" are limited.

In the RLL code, the limitation on the largest number of continuous "0" is referred to as a condition of G constraint, and the limitation on the largest number of continuous "0" in an odd bit or even bit is referred to as a condition of I constraint, and these conditions of constraint are expressed as (0, G/I).

By imposing the condition of G constraint, error propagation is suppressed when decoding a read signal from the magnetic head, and synchronization becomes easy at the time of decoding. Furthermore, by imposing the condition of I constraint, error propagation that cannot be suppressed by the condition of G constraint can be suppressed.

As a method of evaluating whether the DC components are suppressed, there is a method of calculating a peak width of running digital sum (RDS). FIG. 33 is an explanatory diagram of an evaluation method of evaluating the suppressed amount of the DC component.

As shown in FIG. 33, with this evaluation method, when a bit value of a bit string in a recording and reproduction signal is "0", "−1" is added, and when the bit value is "1", "1" is added, to calculate the RDS value.

After finishing calculation of the RDS value for all bit values included in the bit string, a peak width in which an absolute value of the RDS value becomes the largest is calculated. In the case of FIG. 33, the peak width becomes "3".

To reduce the DC component, it is better to have the peak width as small as possible. By checking the RDS value, the suppressed amount of the DC components can be evaluated. Therefore, the DC-free code can be said to be a code capable of reducing the peak width.

In the RLL encoding method, encoding is performed according to a conversion table. When the code rate (information bit length/code bit length) increases, the size of the conversion table also increases. Accordingly, an encoding method that can efficiently perform encoding even when the code rate is large is desired.

When the code rate is relatively large, there is a guided scrambling method to suppress the DC components. In this method, the bit string in the recording and reproduction signal is converted to a plurality of scrambled strings, and peak widths of the respective scrambled strings are calculated. A scrambled string having the smallest peak width is then selected as a scrambled string in which the DC components are suppressed (for example, I. J. Fair, W. D. Grover, W. A. Kryzymien, and R. I. MacDonald, "Guided Scrambling: A New Line Coding Technique for High Bit Rate Fiber Optic Transmission Systems", IEEE Transactions on Communications, Vol. 39, No. 2, February 1991).

However, the conventional technique by the guided scrambling method has a problem in that when the code rate is extremely high, the error rate in recording and reproduction of the signal is hardly improved.

Specifically, the code rate in the longitudinal recording method currently used in the memory unit is as high as 0.99 or higher, but when the same code rate is required in the perpendicular recording method for suppressing the DC components, there is little improvement effect of the error rate even by using the guided scrambling method.

Furthermore, in the conventional guided scrambling method, it is necessary to provide the RLL encoder respectively in a plurality of scramblers that convert the bit string to the scrambled string. However, there is such a problem that the circuit size of the RLL encoder having a high code rate is considerably large, and providing the RLL encoders in a plurality of numbers leads to an increase in the circuit size.

Therefore, in the perpendicular recording method, it is an important object to develop an encoder and a decoder of recording and reproduction signals, which can improve the error rate even when the code rate is high, and reduce the circuit size.

SUMMARY OF THE INVENTION

It is an object of the present invention to at least solve the problems in the conventional technology.

An encoder according to one aspect of the present invention includes an encoded-bit-string generating unit that generates a first bit string encoded by scrambling an input bit string; a direct-current-component evaluating unit that selects a second bit string having a predetermined width in the first bit string, while shifting bits one by one, and evaluates the direct-current component in the second bit string; and a bit-string extracting unit that extracts a third bit string with suppressed direct-current component, based on a result of an evaluation by the direct-current-component evaluating unit.

A decoder according to another aspect of the present invention includes a decoding unit that decodes a bit string encoded by an encoder. The encoder includes an encoded-bit-string generating unit that generates a bit string encoded by scrambling an input bit string; a direct-current-component evaluating unit that selects a bit string having a predetermined width in the bit string generated by the encoded-bit-string generating unit, while shifting bits one by one, and evaluates the direct-current component in the selected bit string; and a bit-string extracting unit that extracts a bit string with suppressed direct-current component, based on a result of an evaluation by the direct-current-component evaluating unit.

A method of encoding a bit string, according to still another aspect of the present invention includes generating a bit string encoded by scrambling an input bit string; selecting a bit string having a predetermined width in the bit string generated at the generating, while shifting bits one by one; evaluating the direct-current component in the selected bit string; and outputting a bit string with suppressed direct-current component, based on a result of an evaluation at the evaluating.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention will be explained below in detail below with reference to the accompanying drawings.

Figure 1:
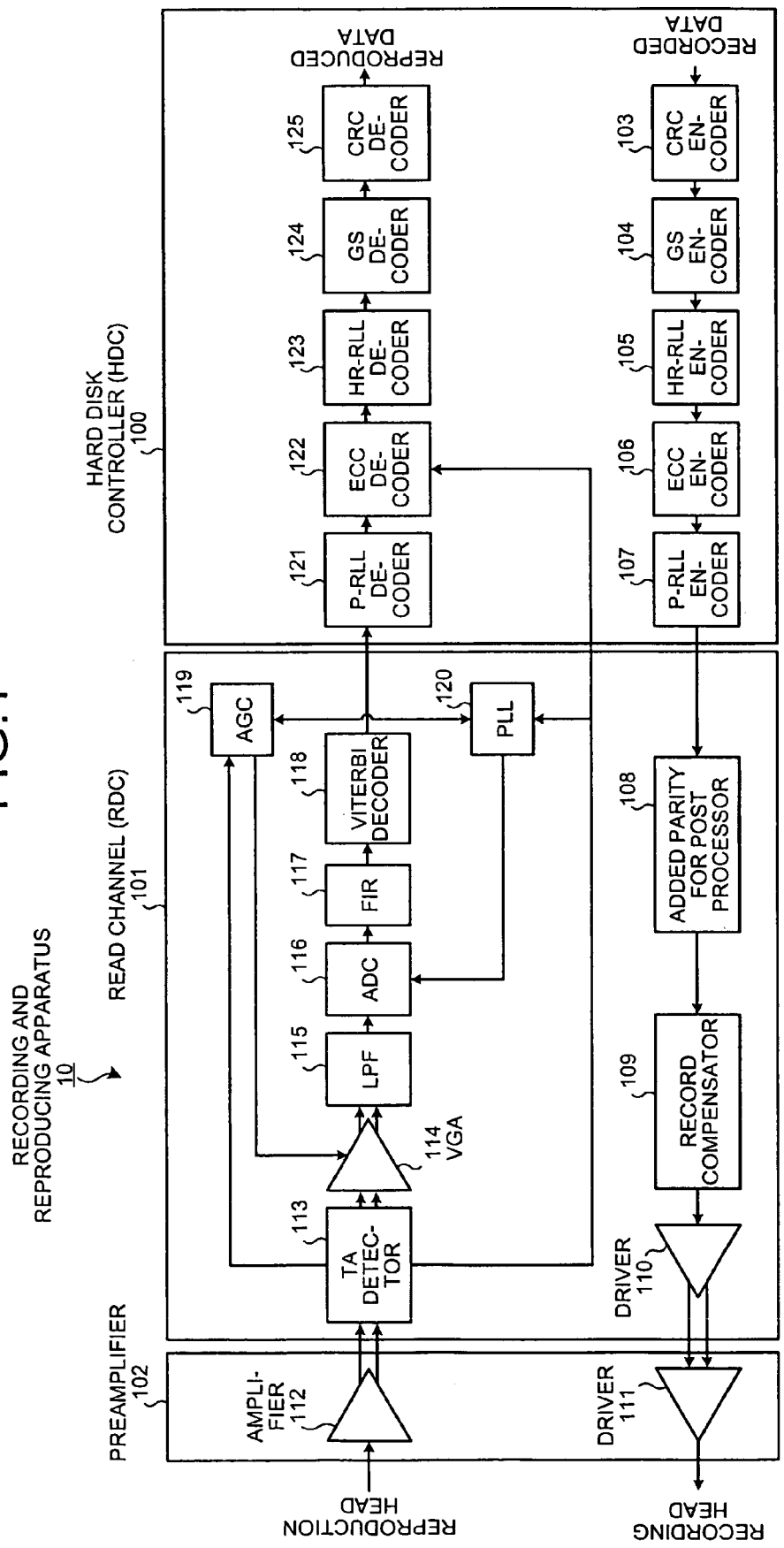
FIG. 1 is a block diagram of a recording and reproducing apparatus according to a first embodiment of the present invention.

FIG. 1 is a functional block diagram of the configuration of a recording and reproducing apparatus 10 according to a first embodiment of the present invention.

While an apparatus that performs recording and reproduction of information for a hard disc will be explained as an example, the present invention can be also applied to other apparatuses that perform recording and reproduction of information for a magneto-optical disk or the like.

The recording and reproducing apparatus 10 according to the first embodiment records and reproduces information for the hard disc, and includes a hard disc controller (HDC) 100, a read channel (RDC) 101, and a preamplifier 102.

When recording data, the HDC 100 performs encoding via a cyclic redundancy check (CRC) encoder 103, a guided-scrambling (GS) encoder 104, a high-rate-run-length-limited (HR-RLL) encoder 105, an error-correcting-code (ECC) encoder 106, and a parity-run-length-limited (P-RLL) encoder 107.

The CRC encoder 103 is an encoder used for performing error detection by using a cyclic code. The GS encoder 104 converts an input information bit string to a plurality of scrambled strings, and determines and outputs one scrambled string, in which DC components are suppressed, from the scrambled strings.

Figure 2:
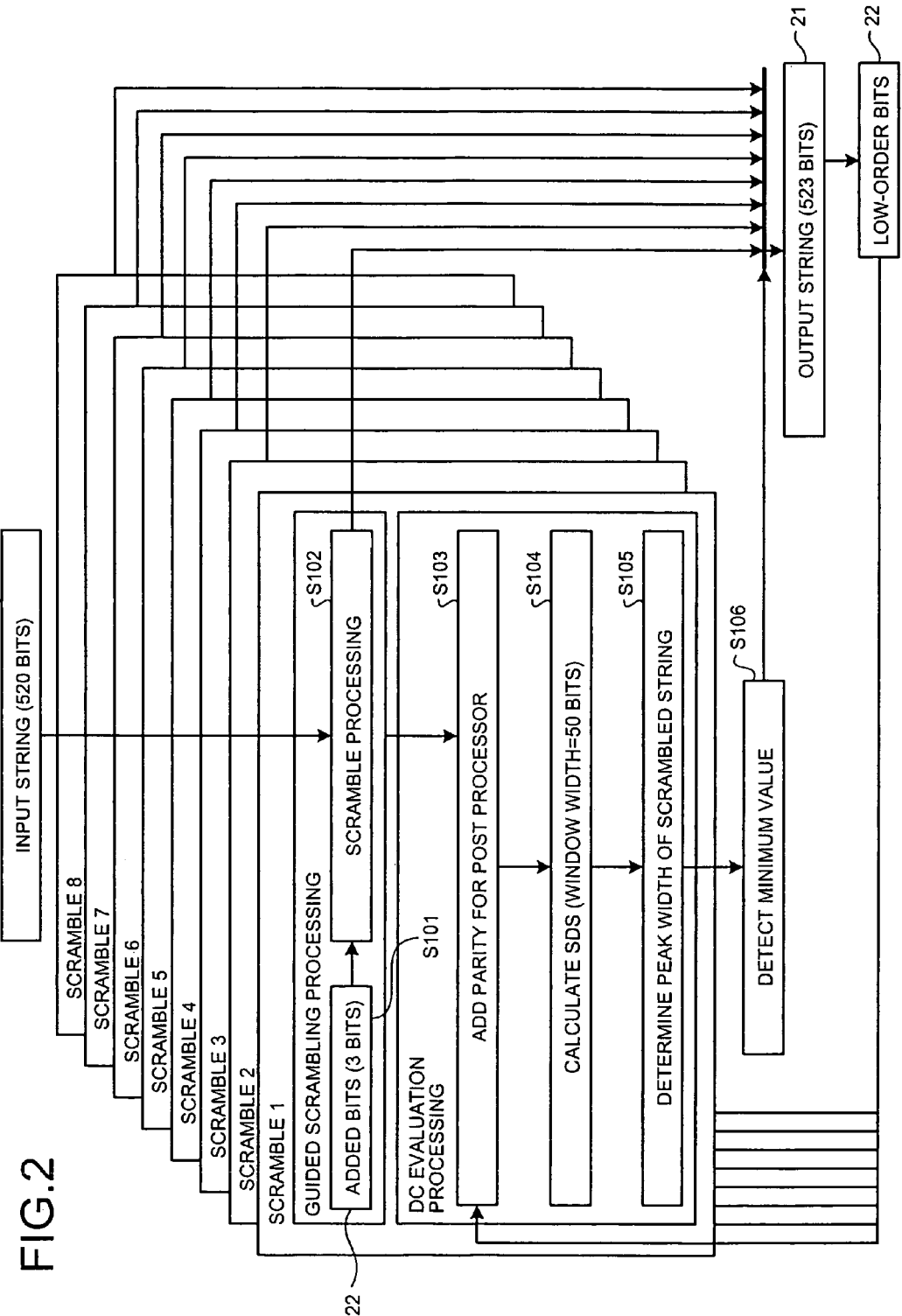
FIG. 2 is a schematic for illustrating an encoding processing performed by a GS encoder.

FIG. 2 is an explanatory diagram of encoding processing performed by the GS encoder 104. In the example shown in FIG. 2, an input string 20 has 520 bits and an output string 21 has 523 bits. In the encoding processing, the GS encoder 104 inserts eight types of 3-bit overhead bit ("000", "001", "010", "011", "100", "110", and "111") for the input string (step S101), to perform scramble processing (step S102).

Figure 3:
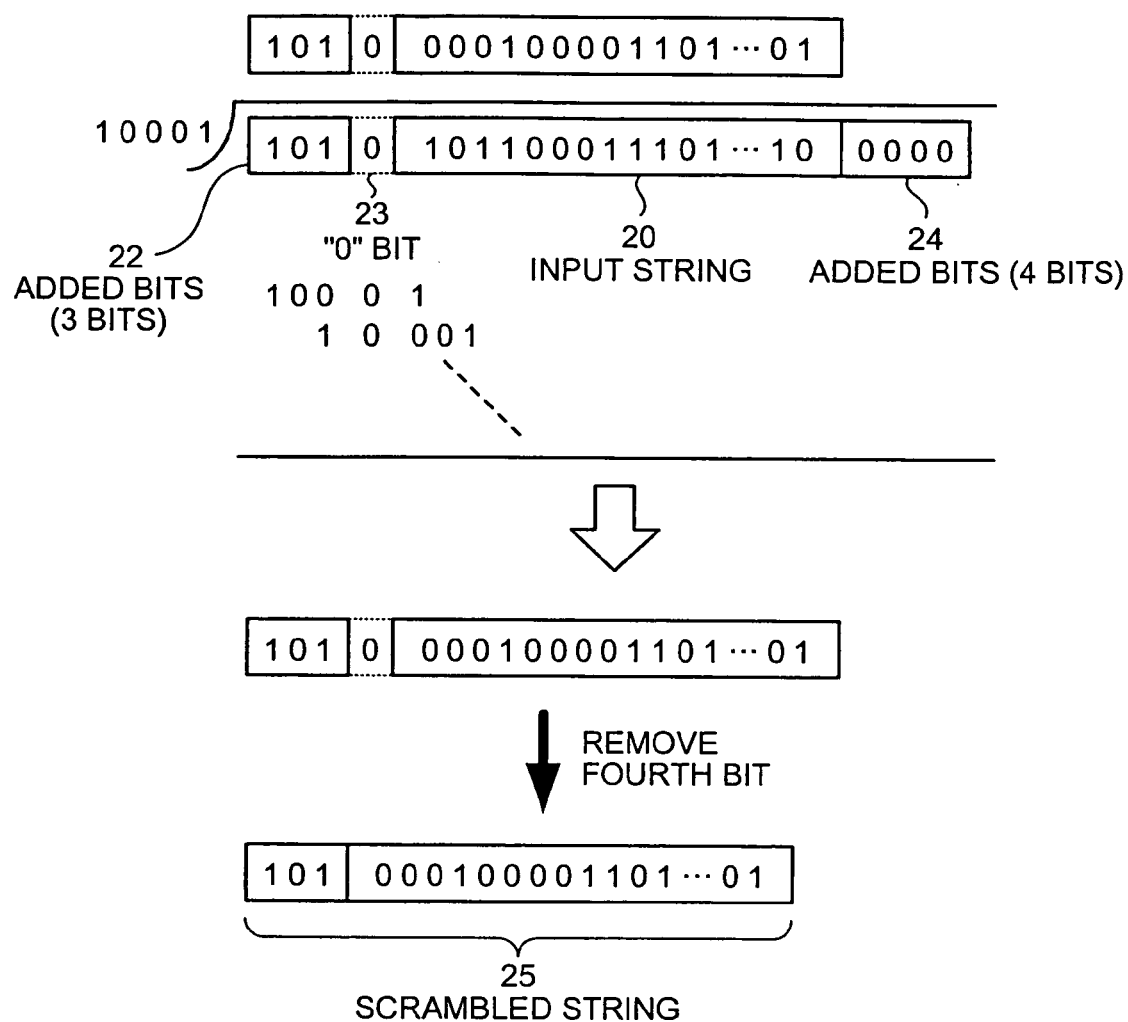
FIG. 3 is a schematic for illustrating a scramble processing performed by the GS encoder.

FIG. 3 is an explanatory diagram of scramble processing performed by the GS encoder 104. For generating the scrambled string, $1+X^4$ is used as a scramble polynomial.

As shown in FIG. 3, the GS encoder 104 adds 3-bit overhead bit 22 and "0" bit 23 in front of the input string 20. The GS encoder 104 also adds 4-bit overhead bit 24 "0000" behind the input string 20.

The GS encoder 104 divides the string by "10001" indicating $1+X^4$, to calculate a bit string as a quotient. Thereafter, the GS encoder 104 removes the fourth bit from the head of the bit string in the quotient to obtain a scrambled string 25.

Thus, when $1+X^4$ is used in the scramble polynomial, in the conventional guided scrambling method, a 4-bit overhead bit is necessary. According to the method of the present invention, however, the 3-bit overhead bit 22 can be used, which is one bit less.

By setting the overhead bit to have 3 bits, the code rate can be increased. Furthermore, there is an advantage in that the number of scrambles can be reduced to half. According to the first embodiment, a "0" bit is added to the input string prior to scrambling, but it is also possible to add a q-bit string prior to scrambling. In this case, there is an advantage in that the number of scrambles can be reduced to $\frac{1}{2}^q$.

The code rate is defined as a ratio of the number of bits of the information bit string to that of the encoded bit string. A high code rate means that the ratio is close to 1, and the closer the ratio approaches 1, the better the encoder's performance is.

Thereafter, the GS encoder 104 generates a bit string same as the bit string recorded in an actual recording medium by adding parity for a post processor 108 to evaluate the amount of DC-component suppression (step S103).

Figure 4:
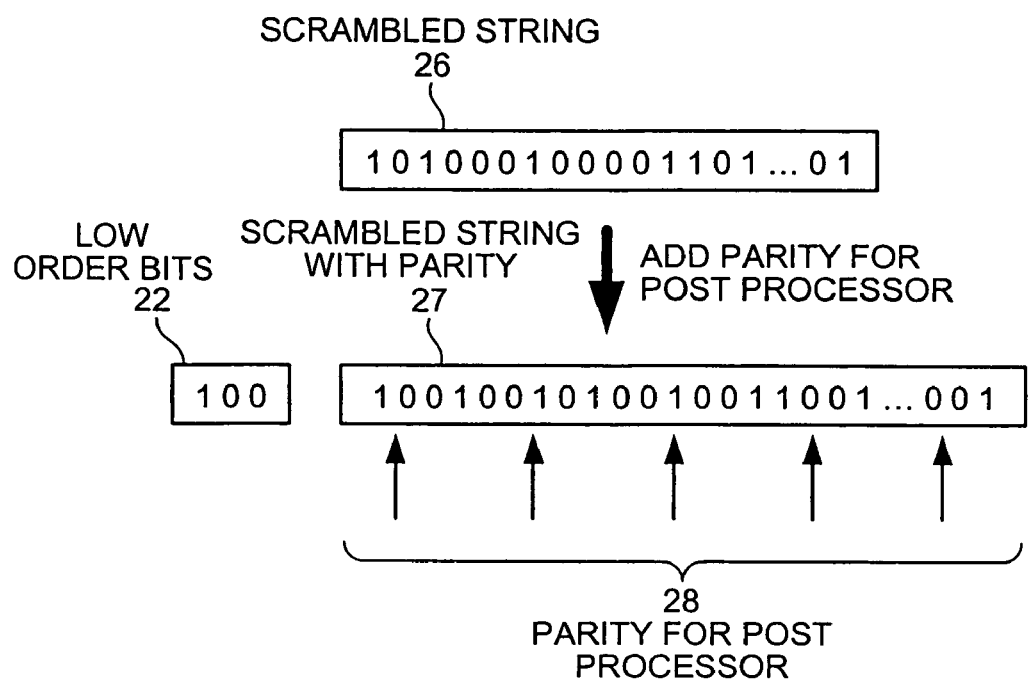
FIG. 4 is a schematic for illustrating a parity addition processing for adding parity for a post processor.
Figure 5:
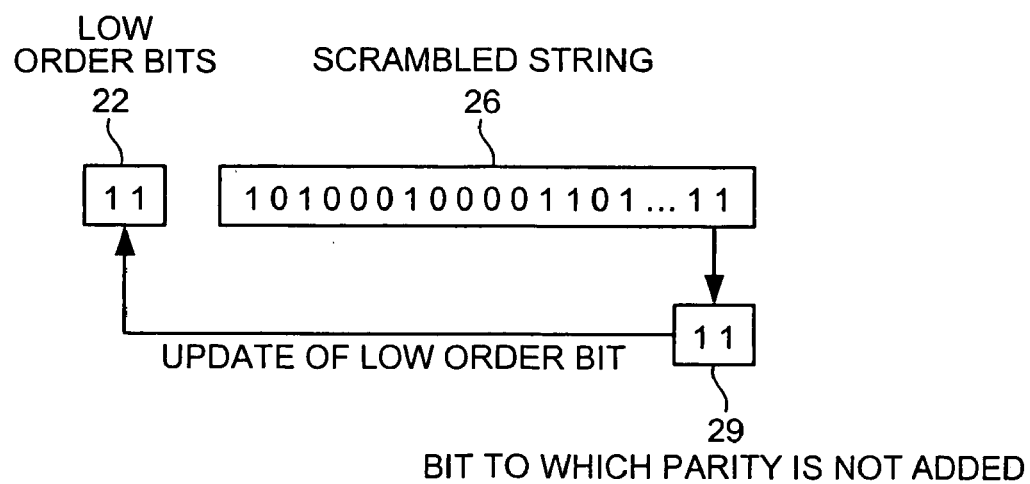
FIG. 5 is a schematic for illustrating a process with respect to a bit to which parity is not added.

FIG. 4 is an explanatory diagram of parity addition processing for adding parity for the post processor 108 and FIG. 5 is an explanatory diagram of a process for a bit to which parity is not added.

As shown in FIG. 4, in the parity addition processing, the parity for the post processor 108 is added for each of predetermined bits (5 bits in the example in FIG. 4). Here, the value of the parity becomes 0 when the sum of 4 bits between parities is even, or becomes 1 when the sum of 4 bits between parities is odd.

However, if the parity is added to from the low order bit in a scrambled string 26 for each of the predetermined bits, there is a bit string to which the parity is not added, in the high order bit in the scrambled string 26.

Therefore, in the parity addition processing, such processing is performed that the bit, to which the parity has not been added, is added as a low order bit 22 at the head of the scrambled string 26, for which the parity addition processing is to be performed next.

In FIG. 5, a bit 29 to which the parity has not been added is shown. The bit 29 is a remainder of the scrambled string 26, to which the parity is not inserted. The bit 29 is added to the head of the scrambled string 26 to be processed next as the low order bit 22.

Returning to FIG. 2, the GS encoder 104 performs SDS (sliding digital sum) calculation for the eight types of scrambled strings added with parity for the post processor, after the parity addition processing for the post processor (step S104).

Figure 6:
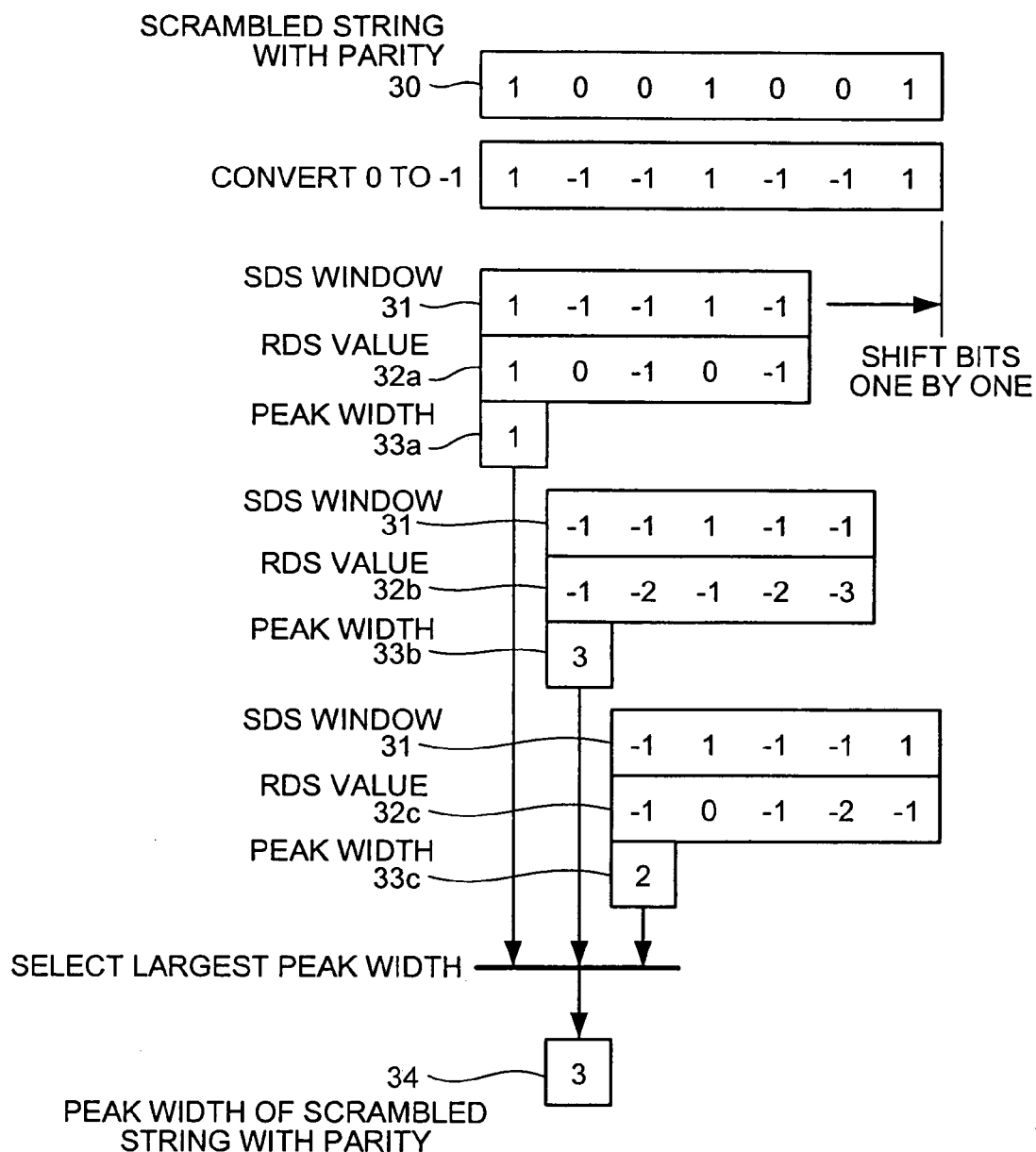
FIG. 6 is a schematic for illustrating SDS calculation.

FIG. 6 is an explanatory diagram of the SDS calculation. As shown in FIG. 6, in the SDS calculation, the GS encoder 104 converts the "0" bit in a scrambled string 30 added with parity to "−1" bit.

The GS encoder 104 sets an SDS window 31 having a 5-bit width and inputs to the SDS window 31 the first 5-bit data in the scrambled string, for which the bit conversion processing has been performed.

While it is explained that the SDS window 31 has the 5-bit width, the SDS window having a 50-bit width is used in practice. The width of the SDS window has an optimum value, and by setting it to 50 bits, the error rate can be effectively improved.

Figure 33:
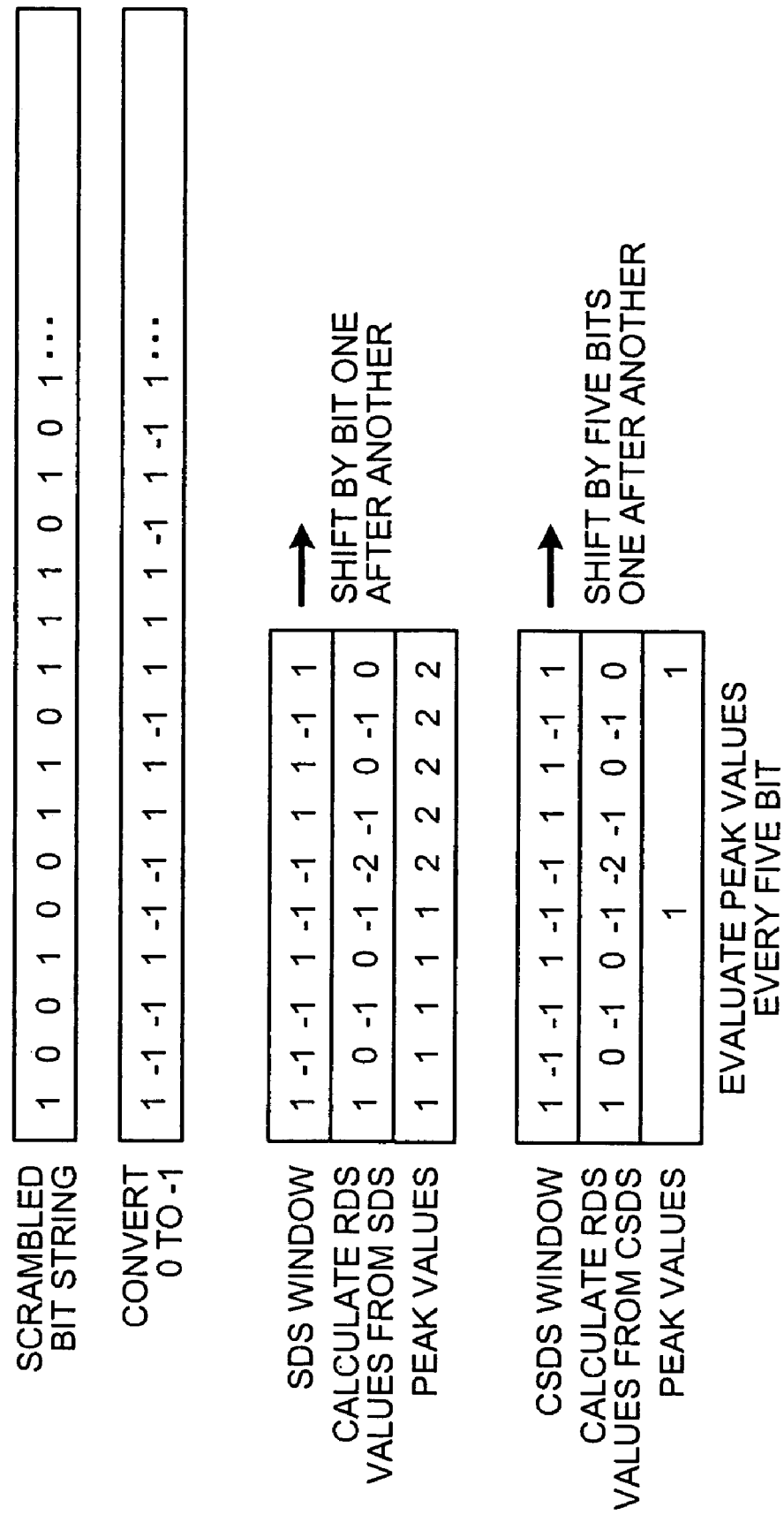
FIG. 33 is a schematic for illustrating an outline of an encoder of a recording and reproducing apparatus according to a second embodiment of the present invention.

The GS encoder 104 calculates an RDS value 32a with respect to the 5-bit bit string input to the SDS window 31, in the manner explanation in FIG. 33, to calculate a peak width 33a of the RDS value 32a.

Thereafter, the GS encoder 104 executes the same calculation while shifting the SDS window 31 by one bit one after another, to calculate RDS values 32b and 32c, and peak widths 33b and 33c.

The GS encoder 104 selects the largest peak width 33b of the peak widths 33a to 33c calculated by shifting the SDS window 31 as a peak width 34 of the scrambled string 30 added with parity.

The GS encoder 104 compares the peak widths for the eight types of scrambled strings with parity for the post processor, obtained in this manner, to select the scrambled string with parity having the smallest peak width (step S106).

Thereafter, the GS encoder 104 deletes the parity from the selected scrambled string with parity and outputs the output string 21, which is a scrambled string with suppressed DC-component. The reason why the parity is removed is to prevent the parity from being added double, since the parity is added later by added parity for the post processor 108.

Thus in the present method, the GS encoder 104 calculates the peak width for the scrambled string including the parity for the post processor. Therefore, the DC-component suppression effect can be evaluated for the bit string same as the bit string actually recorded in the hard disk.

In the conventional guided scrambling method, it is necessary to calculate and evaluate the RDS value in the whole one sector (4096 bits) of the hard disk drive. However, in the present method, the calculation and evaluation of the RDS value are performed only for the input string 20.

In the conventional guided scrambling method, The RDS value is calculated in the whole scrambled string to calculate the peak value. In the present method, however, the RDS value is calculated while shifting the SDS window 31 by predetermined bits, for the predetermined bit width of the SDS window 31, to calculate the peak width.

Figures 7, 8:
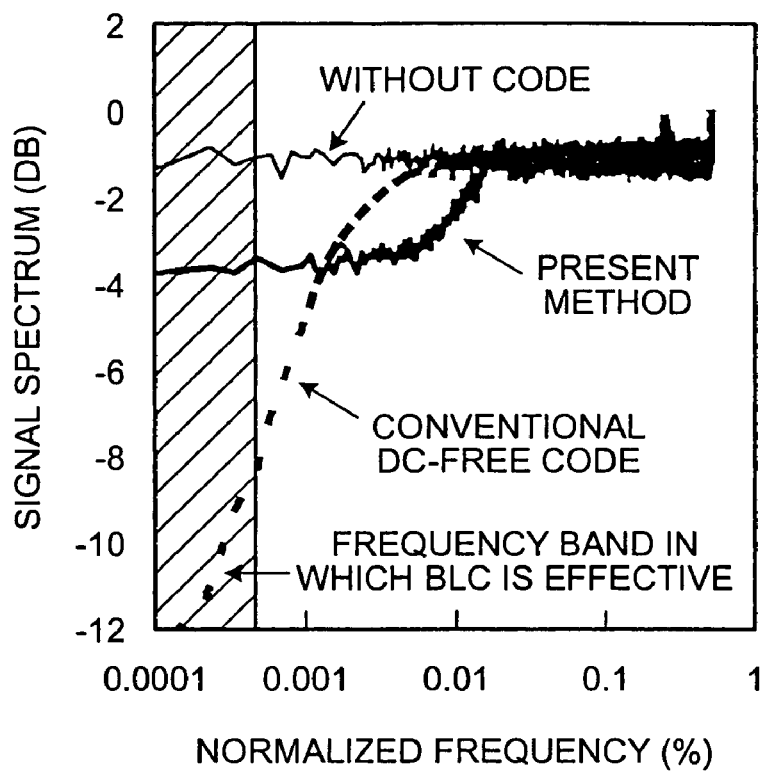
FIG. 7 is a graph of frequency characteristics of a DC-free code in the present method.
FIG. 8 is a schematic for illustrating a descramble processing.

FIG. 7 is a diagram of frequency characteristics of a DC-free code in the present method. In FIG. 7, signal spectrum with respect to a normalized frequency is shown, for the case of having no code, the case of the conventional DC-free code, and the case of the DC-free code in the present method.

As shown in FIG. 7, in the conventional DC-free code, low-pass components of the frequency are suppressed, while in the DC-free code in the present method, middle-pass components of the frequency are suppressed. Since the low-pass components of the frequency are effectively suppressed by performing BLC (base line correction), the low- and middle-pass components of the frequency can be suppressed by combining the DC-free code of the present method and the base line correction, thereby further improving the error rate, as compared to the conventional method.

Returning to FIG. 1, the HR-RLL encoder 105 is a high code-rate encoder that converts an n-bit bit string to an (n+1)-bit bit string satisfying the condition of RLL constraint. In this case, the code rate of the HR-RLL encoder 105 is n/(n+1). The HR-RLL encoder 105 will be explained later in detail.

The ECC encoder 106 is an encoder that adds ECC parity for performing error correction. The P-RLL encoder 107 is an encoder that performs RLL encoding with respect to the ECC parity added by the ECC encoder 106.

The RDC 101 transmits recorded data to a driver 111 of the preamplifier 102 via the post processor 108, a record compensator 109, and the driver 111.

The post processor 108 adds the parity for each 30 bits. Specifically, the post processor 108 calculates exclusive OR (EOR) for each 30 bits, and adds "0" when the value is "0", or adds "1" when the value is "1".

The record compensator 109 performs compensation processing for widening the reversal interval at a position to which the flux reversal is contiguous. The preamplifier 102 generates write current to a recording head by the driver 111.

On the other hand, when reproducing the data, the preamplifier 102 amplifies an analog voltage input from a reproduction head by an amplifier 112 and transmits the amplified analog voltage to the RDC 101. The RDC 101 performs detection processing by a thermal asperity detector (TA detector) 113 and outputs a digital signal via a variable gain amplifier (VGA) 114, a low-pass filter (LPF) 115, and an AD converter (ADC) 116.

The RDC 101 performs a Viterbi decoding by a Viterbi decoder 118 and also performs parity check of the parity added by the post processor 108 to output the signal to the HDC 100, after having performed waveform equalization by an FIR filter (FIR) 117.

The RDC 101 has a PLL 120 that controls timing of signal sampling and an automatic gain controller (AGC) 119 that controls the gain of the variable gain amplifier (VGA) 114.

A P-RLL decoder 121 in the HDC 100 performs decoding of the ECC parity included in the data input by the RDC 101 and, ECC decoder 122 performs error correction based on the ECC parity.

An HR-RLL decoder 123 in the HDC 100 decodes an RLL encoded bit string of a high code rate to an information bit string, by following the encoding processing of the HR-RLL encoder 105 backwards. The HR-RLL decoder 123 will be explained later in detail.

A GS decoder 124 performs descramble processing for decoding the scrambled string encoded by the GS encoder 104. FIG. 8 is an explanatory diagram of the descramble processing.

As shown in FIG. 8, in the descramble processing, "0" bit is inserted in the input string behind the 3-bit overhead bit 22 explained with reference to FIG. 2. The scramble polynomial $1+X^4$ is then multiplied to the input string in which "0" bit is inserted.

Specifically, this calculation can be executed, as shown in FIG. 8, by preparing two input strings in which "0" bit is inserted in the fourth bit from the head of the bit string, shifting one of the input strings by 5 bits and adding these two input strings. The GS decoder 124 outputs the obtained result as an output example of the descramble processing.

Returning to FIG. 1, a CRC decoder 238 in the HDC 100 executes error detection processing using the cyclic code with respect to the output string of the descramble processing and reproduces the data.

The condition of RLL constraint to be satisfied by the HR-RLL encoder 105 shown in FIG. 1 will be explained below. The common condition of RLL constraint, which the HR-RLL encoder 105 should satisfy, includes a condition of G constraint and a condition of X constraint.

The condition of G constraint is a condition of constraint for limiting the maximum number of bits of continuous 0 in the information bit string, and the condition of X constraint is a condition of constraint for limiting the maximum number of bits of continuous 0 for every predetermined number of bits in the information bit string.

Particularly, in the condition of X constraint, a condition of constraint for limiting the maximum number of bits of continuous 0 for every two bits in the information bit string is referred to as a condition of I constraint. Error propagation in data is suppressed by the condition of G constraint, and synchronization becomes easy at the time of decoding the data. Furthermore, error propagation in data, which is not suppressed by the condition of G constraint, is suppressed by the condition of I constraint.

The HR-RLL encoder 105 that generates an RLL code of a high code rate satisfying the condition of G constraint and the condition of I constraint in the information bit string and between the information bit strings will be explained.

According to the first embodiment, more specifically, the condition of constraint that the HR-RLL encoder 105 should satisfy is expressed as (0, G/I, r/R, l/L)=(0, 12/12, 6/6, 6/6)

where G is condition of 12 constraint, the maximum number of bits of continuous 0 is 12 bits, I is condition of 12 constraint, and the maximum number of bits of continuous 0 when seeing even and odd bits is 12 bits.

The condition of G constraint and the condition of I constraint should be satisfied not only in the relevant information bit string, but also between the relevant information bit string and the right or left information bit string thereof. Therefore, the following condition of constraint is applied to the right or left information bit string of the relevant information bit string:

r=recondition of 6 right end constraint, the maximum number of bits of continuous 0 at the right end is 6 bits;

l=condition of 6 left end constraint, the maximum number of bits of continuous 0 at the left end is 6 bits;

R=condition of 6 right end constraint, the maximum number of bits of continuous 0 at the right end when seeing even and odd bits is 6 bits; and L=condition of 6 left end constraint, the maximum number of bits of continuous 0 at the left end when seeing even and odd bits is 6 bits.

That is, there are the following relations between the conditions of right end constraint r, R, or the conditions of left end constraint l, L in the relevant information bit string, and the conditions of left end constraint l, L in the right side information bit string of the relevant information bit string or the conditions of right end constraint r, R in the left side information bit string of the relevant information bit string.

Condition of right end constraint r in the relevant information bit string+condition of left end constraint l in the right side information bit string≦condition of G constraint.

Condition of left end constraint l in the relevant information bit string+condition of right end constraint r in the left side information bit string≦condition of G constraint.

Condition of right end constraint R in the relevant information bit string+condition of left end constraint L in the right side information bit string≦condition of I constraint.

Condition of left end constraint L in the relevant information bit string+condition of right end constraint R in the left side information bit string≦condition of I constraint.

Hereinafter, the condition of r constraint, the condition of l constraint, the condition of R constraint, and the condition of L constraint do not appear on the surface, but are applied as the conditions of constraint for the right-end-processing and the left-end-processing.

Figure 9A:
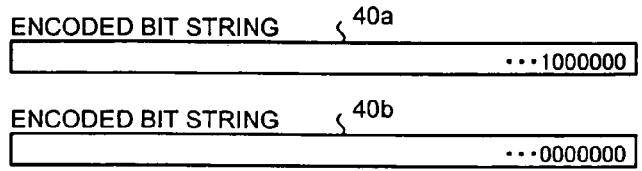
FIG. 9A is a schematic for illustrating an example of a condition of r=6 constraint.

A specific example of the condition of RLL constraint will be explained with reference to FIGS. 9-1 to 9-4. FIG. 9A is a diagram of a specific example of the condition of r=6 constraint, FIG. 9B is a diagram of a specific example of the condition of l=6 constraint, FIG. 9C is a diagram of a specific example of the condition of R=6 constraint, and FIG. 9D is a diagram of a specific example of the condition of L=6 constraint.

As shown in FIG. 9A, an encoded bit string 40a is a bit string that does not violate the condition of r=6 constraint (there is no possibility of violation of the condition of G constraint), and an encoded bit string 40b is a bit string that violates the condition of r=6 constraint (there is the possibility of violation of the condition of G constraint).

Figure 9B:
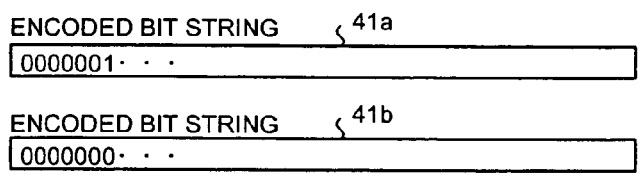
FIG. 9B is a schematic for illustrating an example of a condition of l=6 constraint.

As shown in FIG. 9B, an encoded bit string 41a is a bit string that does not violate the condition of l=6 constraint (there is no possibility of violation of the condition of G constraint), and an encoded bit string 41b is a bit string that violates the condition of l=6 constraint (there is the possibility of violation of the condition of G constraint).

Figure 9C:
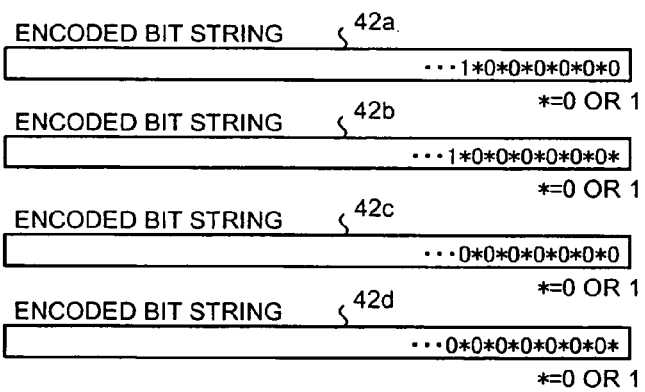
FIG. 9C is a schematic for illustrating an example of a condition of R=6 constraint.
Figure 9D:
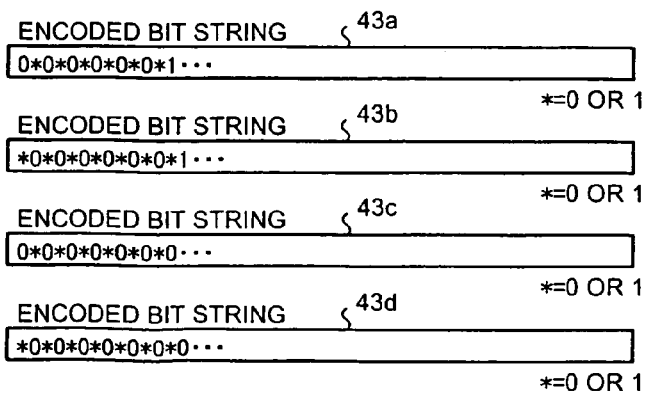
FIG. 9D is a schematic for illustrating an example of a condition of L=6 constraint.

As shown in FIG. 9C, encoded bit strings 42a and 42b are bit strings that do not violate the condition of R=6 constraint (there is no possibility of violation of the condition of I constraint), and encoded bit strings 42c and 42d are bit strings that violate the condition of R=6 constraint (there is the possibility of violation of the condition of I constraint).

As shown in FIG. 9D, encoded bit strings 43a and 43b are bit strings that do not violate the condition of L=6 constraint (there is no possibility of violation of the condition of I constraint), and encoded bit strings 43c and 43d are bit strings that violate the condition of L=6 constraint (there is the possibility of violation of the condition of I constraint).

Figure 10:
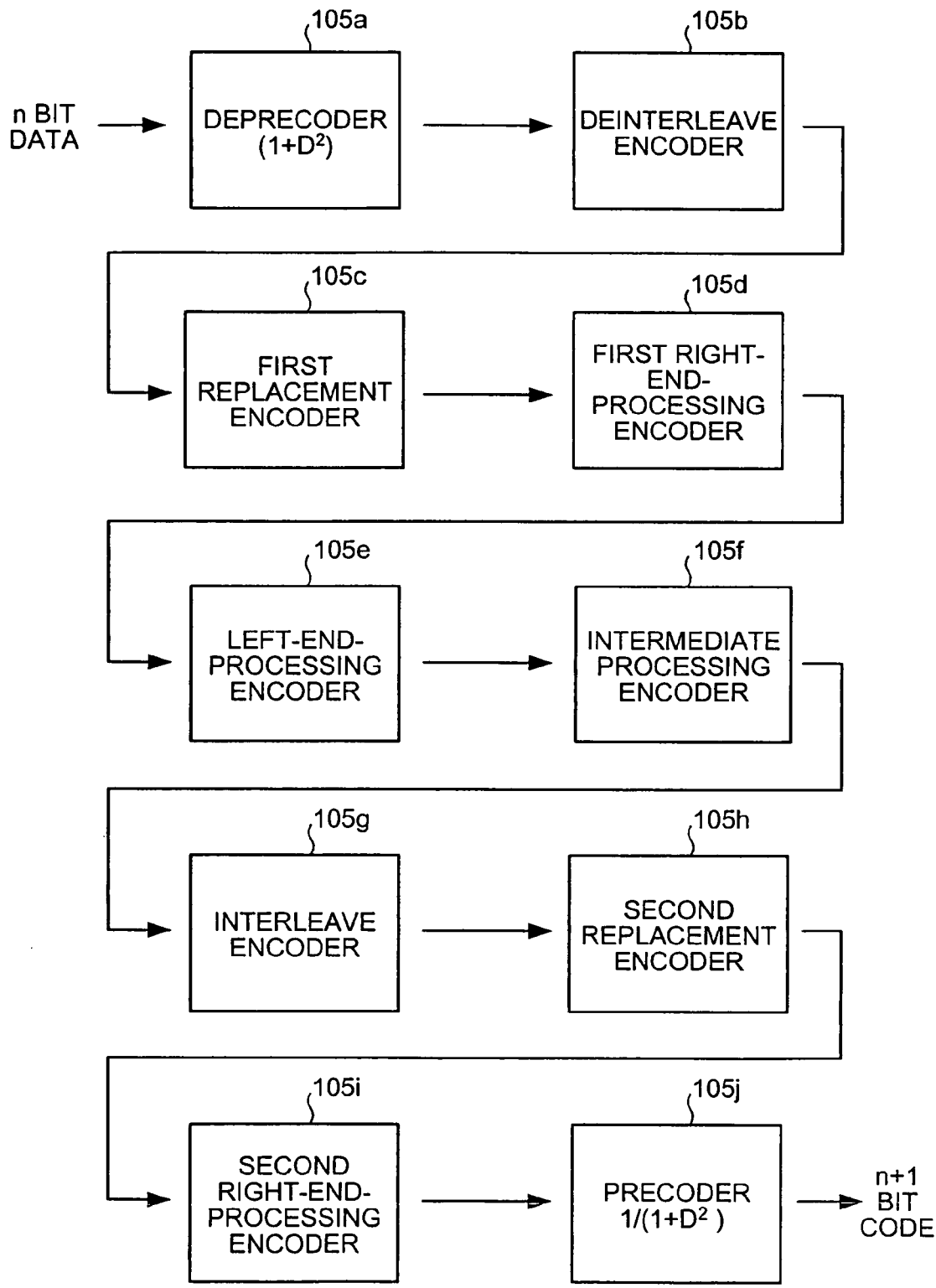
FIG. 10 is a block diagram of an HR-RLL encoder shown in FIG. 1.

The configuration of the HR-RLL encoder 105 shown in FIG. 1 will be explained with reference to FIG. 10. FIG. 10 is a functional block diagram of the configuration of the HR-RLL encoder 105 shown in FIG. 1.

As shown in FIG. 10, the HR-RLL encoder 105 is an encoder having a high code rate, which converts the information bit string of n=523 bits to an encoded bit string of (n+1)=524 bits.

The HR-RLL encoder 105 includes a deprecoder 105a, a deinterleave encoder 105b, a first replacement encoder 105c, a first right-end-processing encoder 105d, a left-end-processing encoder 105e, an intermediate processing encoder 105f, an interleave encoder 105g, a second replacement encoder 105h, a second right-end-processing encoder 105i, and a precoder 105j.

Figure 11:
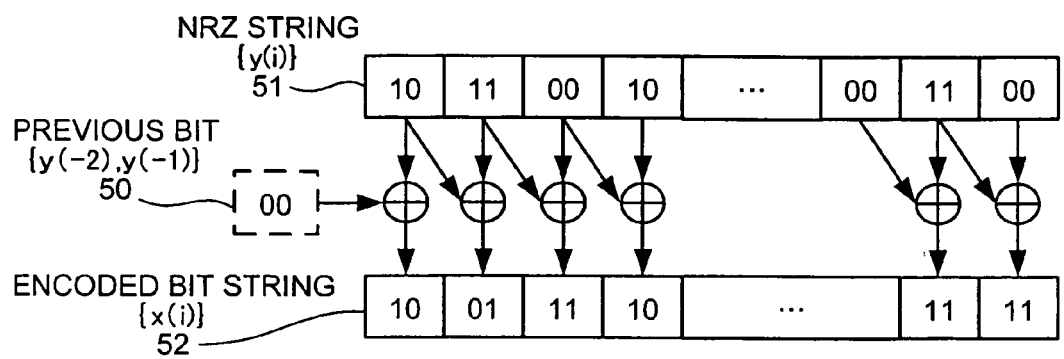
FIG. 11 is a schematic for illustrating a $1+D^2$ processing.

The deprecoder 105a is an encoder that performs $1+D^2$ processing for converting a NRZ (Non Return to Zero) string of n=523 bits to an encoded bit string. FIG. 11 is an explanatory diagram of the $1+D^2$ processing.

In the $1+D^2$ processing, an NRZ string 51 $\{y(i)\}$ is converted to an encoded bit string 52 $\{x(i)\}$ by using $x(i)=y(i)+y(i-2)$ where $y(-2)=y(-1)=0$.

Specifically, as shown in FIG. 11, the encoded bit string 52 $\{x(i)\}$ is calculated by performing EOR calculation, using the previous bit 50 ($y(-2)=y(-1)=0$) and the NRZ string 51 $\{y(i)\}$.

Figure 12:
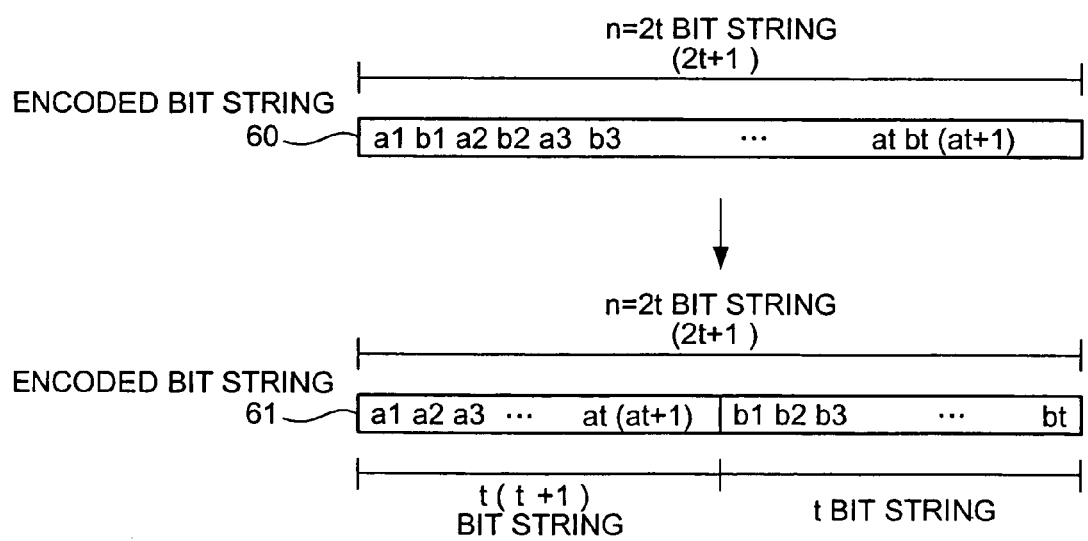
FIG. 12 is a schematic for illustrating a deinterleave processing.

The deinterleave encoder 105b is an encoder that executes deinterleave processing. FIG. 12 is an explanatory diagram of the deinterleave processing.

As shown in FIG. 12, the deinterleave encoder 105b picks up bits alternately one by one from the head bit in the encoded bit string 60, to generate two bit strings ($a_1$ to $a_t(a_{t+1})$ and $b_1$ to $b_t$), and combines these two bit strings to generate a new encoded bit string 61.

The first replacement encoder 105c is an encoder that extracts a 12-bit bit string from a bit string violating the condition of G constraint in the encoded bit string, and performs replacement processing for replacing the extracted bit string by a 12-bit address string.

Figure 13:
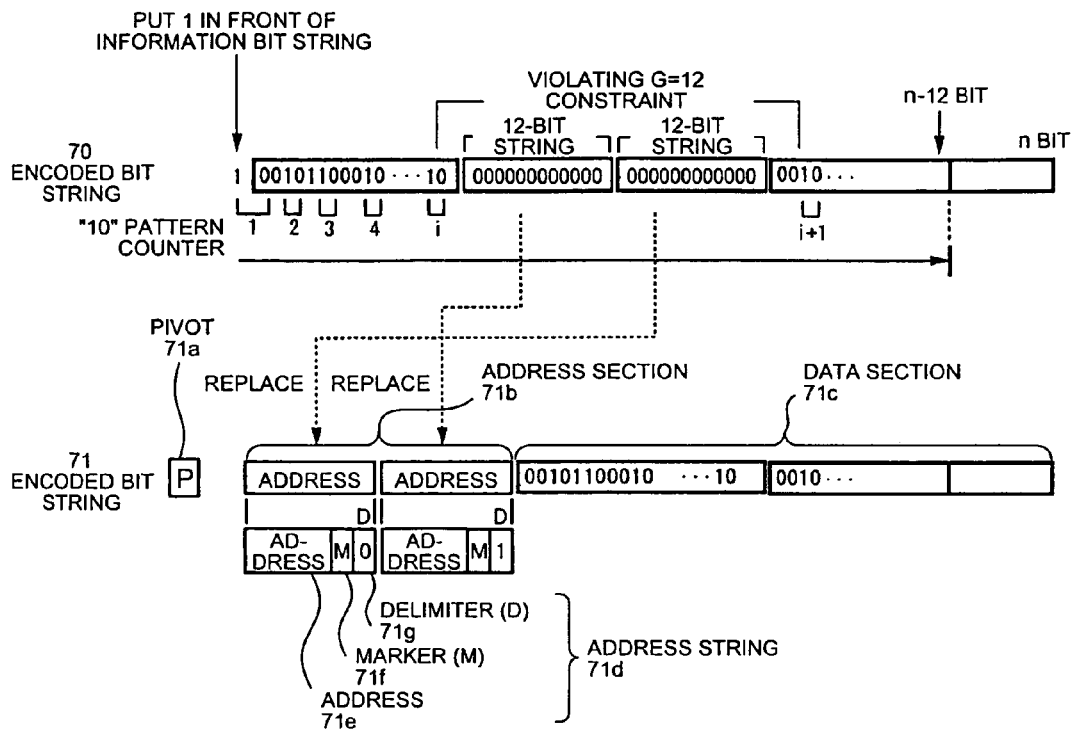
FIG. 13 is a schematic for illustrating conversion of an encoded bit string by a first replacement encoder.

An example in which the first replacement encoder 105c shown in FIG. 10 converts the encoded bit string will be explained with reference to FIG. 13. FIG. 13 depicts an example in which the first replacement encoder 105c converts the encoded bit string.

As shown in FIG. 13, an encoded bit string 70 includes a bit string violating the condition of G=12 constraint, that is, 0 bit string exceeding 12 bits.

The first replacement encoder 105c sets "1" in front of the encoded bit string 70, and counts the number of "10" pattern by a "10" pattern counter from the head.

The first replacement encoder 105c then obtains a 10-bit address code from the number of the "10" pattern and an address code conversion table, and designates it as an address of the bit string violating the condition of G=12 constraint.

As shown in FIG. 13, the first replacement encoder 105c extracts the 12-bit bit string from the bit string violating the condition of G=12 constraint, and replaces the extracted 12-bit bit string by a 12-bit address string.

By performing such replacement, the first replacement encoder 105c can convert the encoded bit string 70 to an encoded bit string 71 satisfying the condition of G=12 constraint.

The encoded bit string 71 has a pivot 71a, an address section 71b, and a data section 71c. The pivot 71a is 1-bit data for identifying whether the encoded bit string 71 satisfies the condition of RLL constraint, and is defined described below:

P=0, Input encoded bit string 70 satisfies all conditions of G, I, r, R, l, and L constraints; and P=1, Input encoded bit string 70 does not satisfy any one of conditions of G, I, r, R, l, and L constraints.

The address section 71b has a plurality of address strings that have been substituted for the bit strings violating the condition of G constraint or the condition of I constraint. For example, the address string 71d has an address 71e, a marker (M) 71f, and a delimiter (D) 71g.

The address 71e is a 10-bit address code obtained from the number of "10" pattern and the address code conversion table explained later.

The marker (M) 71f is 1-bit data and is defined as follows:

M=1, Indicating that the replacement processing of the bit string violating the condition of G constraint by the address string is prior to the interleave processing; and M=0, Indicating that the replacement processing of the bit string violating the condition of G constraint by the address string is after the interleave processing.

The delimiter 71g is 1-bit data, and is defined as follows:

D=1, Indicating that the data section 71c comes after the delimiter 71g; and D=0, Indicating that another address string comes after the delimiter 71g.

The address code conversion table for obtaining the address code from the number of "10" pattern in the encoded bit string 70 shown in FIG. 13, before or after the interleave processing, will be explained.

In the address code conversion table, the number of "10" pattern in the encoded bit string 70 shown in FIG. 13 and the 10-bit address code before the interleave processing are made to correspond one to one, and the following bit strings having the possibility of violating the condition of G=12 constraint and the condition of I=12 constraint are removed from the address code:

(a) 000000****; and (b) *0*0*0*0*0 where "*" expresses "0" or "1" bit.

Thus, the first replacement encoder 105c generates the address string by using the address code conversion table in which the bit strings having the possibility of violating the condition of G constraint and the condition of I constraint are removed. Accordingly, the address string can be used for the RLL code having a high code rate, which satisfies the condition of G constraint and the condition of I constraint.

The first right-end-processing encoder 105d is an encoder that performs right-end-processing in which the right-end 12-bit bit string including the "0" bit string at the right end in the encoded bit string is extracted, and the extracted bit string is replaced by a 12-bit address string in which a particular bit string in the extracted bit string is left therein.

Figure 14:
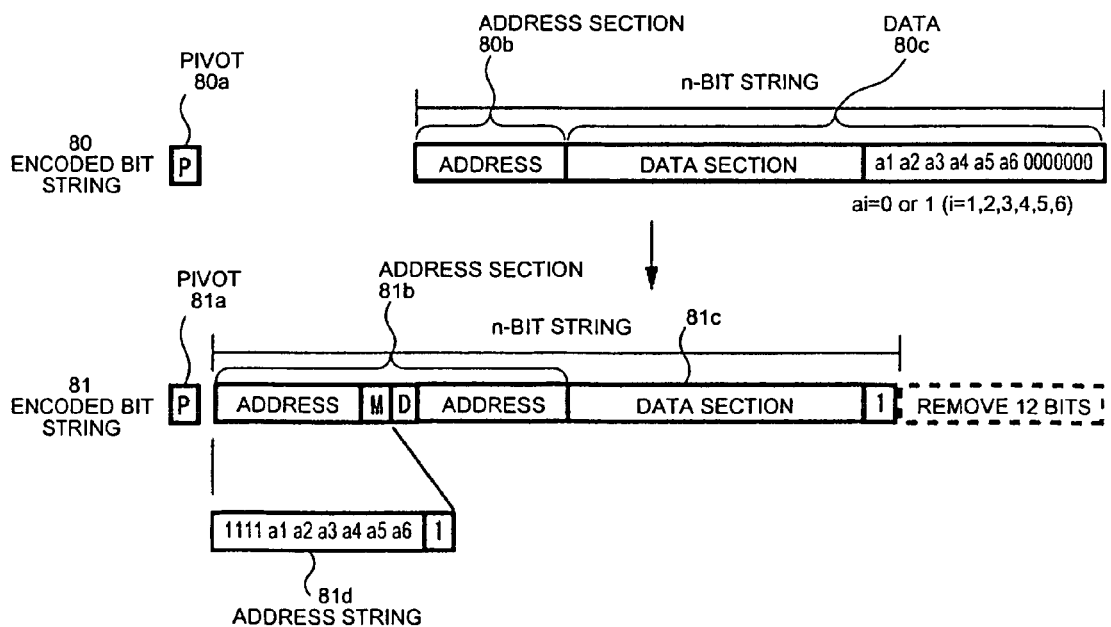
FIG. 14 is a schematic for illustrating conversion of an encoded bit string to an encoded bit string satisfying a condition of I=12 constraint by a first right-end-processing encoder.

An example in which the first right-end-processing encoder 105d shown in FIG. 10 converts an encoded bit string to an encoded bit string satisfying the condition of I=12 constraint will be explained, with reference to FIG. 14. FIG. 14 depicts an example in which the first right-end-processing encoder 105d converts an encoded bit string to an encoded bit string satisfying the condition of I=12 constraint.

As shown in FIG. 14, an encoded bit string 80 includes a bit string having the possibility that violation of the condition of I=12 constraint occurs between the encoded bit string 80 and the right encoded bit string after the interleave processing, that is, a bit string of continuous "0" exceeding 6 bits at the right end of the encoded bit string 80.

The first right-end-processing encoder 105d performs the right-end-processing to extract a 13-bit bit string at the right end of the encoded bit string 80, replace the bit string by an address string 81d using the first 6 bits in the extracted 13 bits, and add "1" bit to the last bit of the encoded bit string 80.

By performing the right-end-processing in this manner, the first right-end-processing encoder 105d can convert the data section 80c to a data section 81c satisfying the condition of I=12 constraint between the encoded bit string 80 and the right encoded bit string.

Returning to FIG. 3, the left-end-processing encoder 105e is an encoder that performs left-end-processing in which the left-end 12-bit bit string including the "0" bit string at the left end in the information bit string is extracted, and the extracted bit string is replaced by a 12-bit address string in which a particular bit string in the extracted bit string is left therein.

Figure 15:
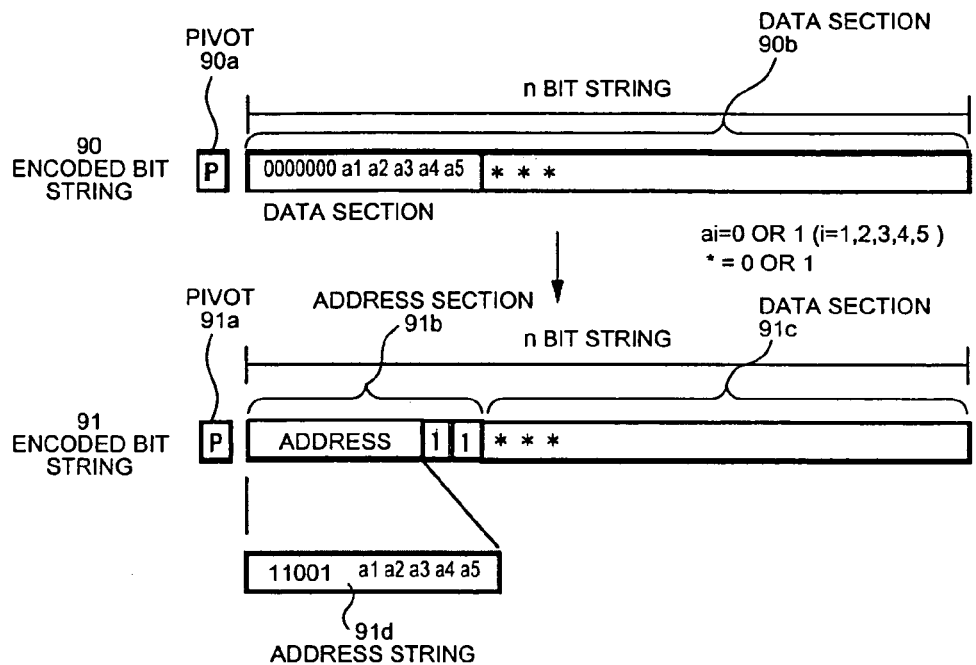
FIG. 15 is a schematic for illustrating conversion of an encoded bit string to an encoded bit string satisfying the condition of I=12 constraint by a left-end-processing encoder.

With reference to FIG. 15, an example in which the left-end-processing encoder 105e shown in FIG. 10 converts an encoded bit string to an encoded bit string satisfying the condition of I=12 constraint will be explained. FIG. 15 depicts an example in which the left-end-processing encoder 105e converts an encoded bit string to an encoded bit string satisfying the condition of I=12 constraint.

As shown in FIG. 15, an encoded bit string 90 includes a bit string having the possibility that violation of the condition of I=12 constraint occurs between the encoded bit string 90 and the left encoded bit string after the interleave processing, that is, a bit string of continuous "0" exceeding 6 bits at the left end of the encoded bit string 90.

The left-end-processing encoder 105e performs the left-end-processing to extract a 12-bit bit string at the left end of the encoded bit string 90, replace the bit string by an address string 91d in which the latter 5 bits in the extracted 12 bits are left.

By performing the left-end-processing in this manner, the left-end-processing encoder 105e can convert the encoded bit string 90 to an encoded bit string 91 satisfying the condition of I-12 constraint between the encoded bit string 90 and the left encoded bit string.

The intermediate processing encoder 105f is an encoder that extracts a 12-bit bit string including the "0" bit string at the left of the center of the data string, and replaces the extracted bit string by a 12-bit address string in which a particular bit string in the extracted bit string is left therein.

Figure 16:
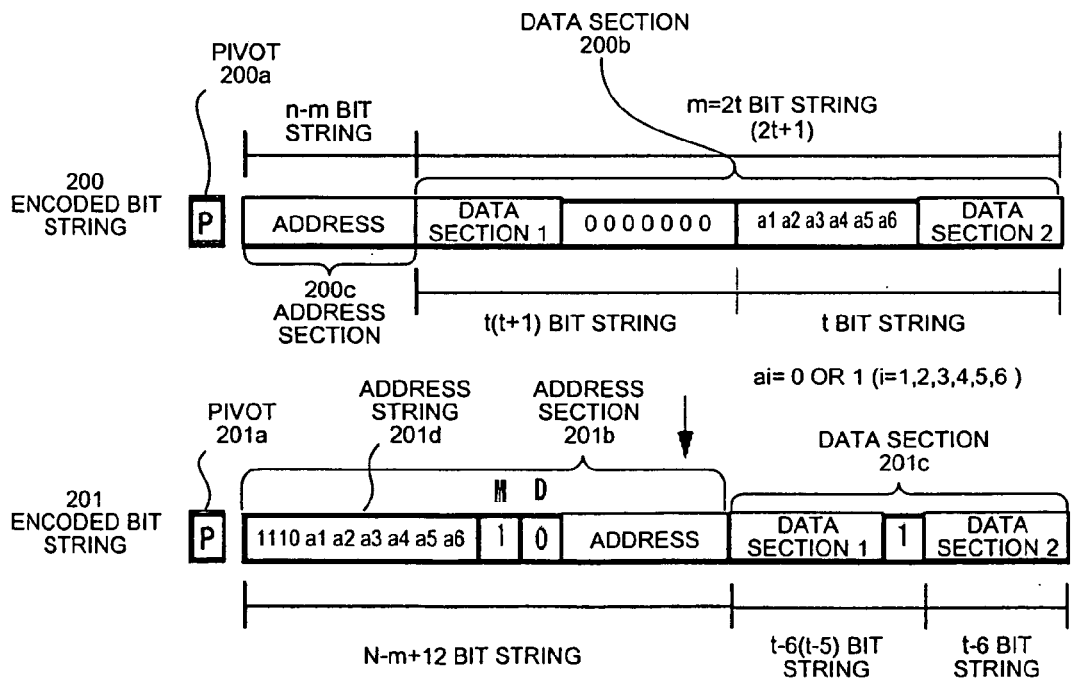
FIG. 16 is a schematic for illustrating conversion of an encoded bit string to an encoded bit string satisfying the condition of I=12 constraint by an intermediate processing encoder.

An example in which the intermediate processing encoder 105f shown in FIG. 10 converts an encoded bit string to an encoded bit string satisfying the condition of I=12 constraint will be explained with reference to FIG. 16. FIG. 16 depicts an example in which the intermediate processing encoder 105f converts an encoded bit string to an encoded bit string satisfying the condition of I=12 constraint.

As shown in FIG. 16, an encoded bit string 200 includes a bit string having the possibility of violating the condition of I=12 constraint after the interleave processing, that is, a bit string of continuous "0" exceeding 6 bits at the left of the center of the encoded bit string 200, in a data section 200b.

The intermediate processing encoder 105f extracts a 13-bit bit string in the middle of the data section 200b, replaces the bit string by an address string 201d in which the latter 5 bits in the extracted 13 bits are left, and substitutes "1" bit for the 13-bit bit string between a data section 1 and a data section 2.

By performing the intermediate processing in this manner, the intermediate processing encoder 105f can convert the data section 200b to a data section 201c satisfying the condition of I=12 constraint between the encoded bit string 200 and the right encoded bit string after the interleave processing.

The interleave encoder 105g is an encoder that performs the interleave processing in which a data section is divided into a plurality of bit strings, to extract a bit one by one sequentially from the bit strings, the extracted bits are sequentially arranged one by one, and the data section is replaced by a newly generated bit string.

Figure 17:
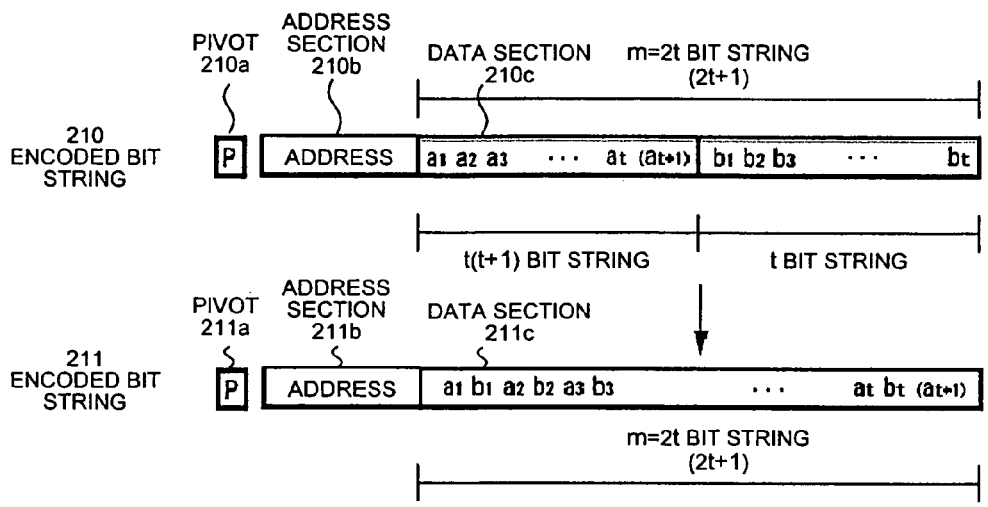
FIG. 17 is a schematic for illustrating conversion of an encoded bit string satisfying the condition of G=12 constraint to an encoded bit string satisfying the condition of I=12 constraint by an interleave encoder.

An example in which the interleave encoder 105g converts an encoded bit string satisfying the condition of G=12 constraint to an encoded bit string satisfying the condition of I=12 constraint will be explained with reference to FIG. 17. FIG. 17 depicts an example in which the interleave encoder 105g converts the encoded bit string satisfying the condition of G=12 constraint to the encoded bit string satisfying the condition of I=12 constraint.

As shown in FIG. 17, the interleave encoder 105g divides a data section 210c of an encoded bit string 210 into two bit strings in the middle thereof.

For example, when the data section 210c has even bits of m=2t, the data section 210c is divided into two bit strings of t bits. When the data section 210c has odd bits of m=(2t+1), the data section 210c is divided into, for example, a first half of (t+1) bits, and a latter half of t bits.

The interleave processing is then performed to replace the data section 210c by a bit string of m=2t bits or m=(2t+1) bits newly generated by arranging the bits from the head of the first half bit string and the head of the latter half bit string alternately one by one.

By performing the interleave processing in this manner, the data section 210c satisfying the condition of G=12 constraint can be converted to a data section 211c satisfying the condition of I constraint.

The second replacement encoder 105h is an encoder that extracts a 12-bit bit string from a bit string violating the condition of G constraint in the data section and replaces the extracted bit string by an address string from the bit string.

The second replacement encoder 105h extracts the 12-bit bit string from the bit string violating the condition of G=12 constraint in the encoded bit string, according to the method explained with reference to FIG. 13, and replaces the extracted 12-bit bit string by the 12-bit address string.

By performing the replacement processing, the second replacement encoder 105h can convert the data section in the encoded bit string to a data section satisfying the condition of G=12 constraint.

Here, the second replacement encoder 105h obtains a 10-bit address code from the number of "10" pattern and the address code conversion table, as in the first replacement encoder 105c, and designates the 10-bit address code as the address of the bit string violating the condition of G=12 constraint.

The address code conversion table used here is for associating the number of "10" pattern in the encoded bit string with the 10-bit address code in a one-to-one correspondence, and the following bit strings having the possibility of violating the condition of G=12 constraint and the condition of I=12 constraint are removed from the address code:

(a) 000000****;
(b) 0*0*0*0*0*;
(c) *0*0*0*0*0; and
(d) ****000000 where "*" expresses "0" or "1" bit.

Since the second replacement encoder 105h generates an address string by using the address code conversion table in which bit strings having the possibility of violating the condition of G constraint and the condition of I constraint are removed, the address string can be used for the RLL code having a high code rate satisfying the condition of G constraint and the condition of I constraint.

The second right-end-processing encoder 105i is an encoder that extracts a 12-bit bit string including the "0" bit string at the right end of the data section, which violates the condition of r constraint, and replaces the extracted bit string by a 12-bit address string in which a particular bit string in the extracted bit string is left therein.

Figure 18:
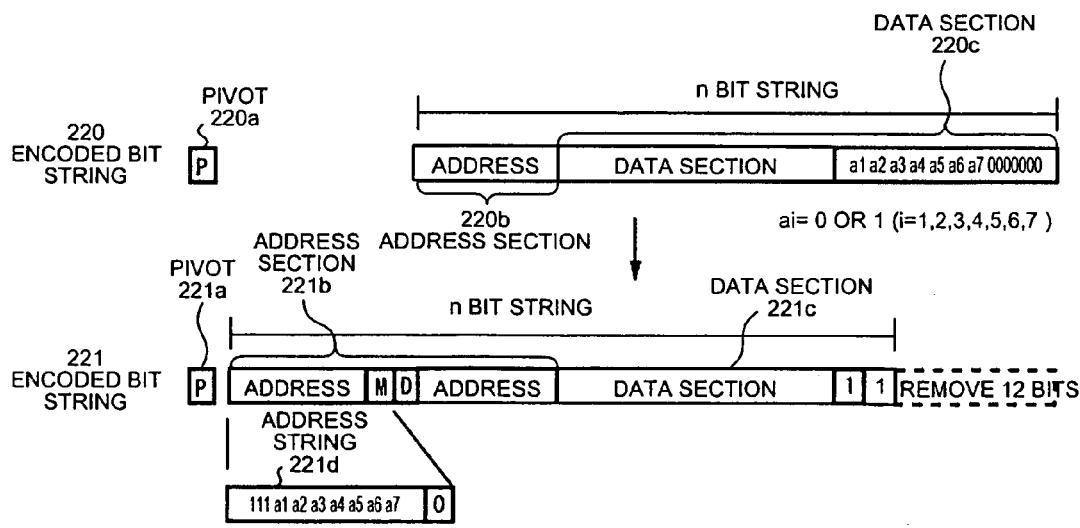
FIG. 18 is a schematic for illustrating conversion of an encoded bit string to an encoded bit string satisfying the condition of G=12 constraint between the encoded bit string and the right encoded bit string, when a data section is larger than 13 bits by a second right-end-processing encoder.
Figure 19:
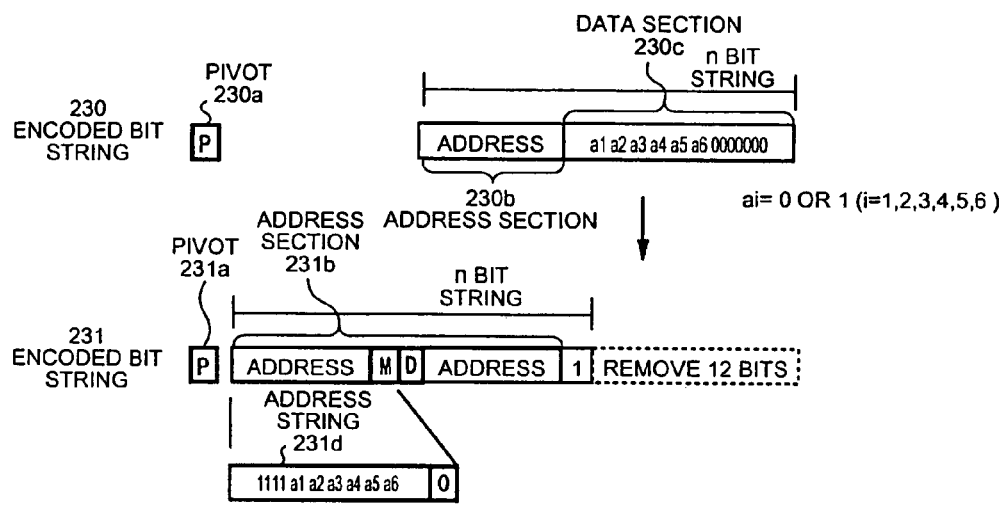
FIG. 19 is a schematic for illustrating conversion of an encoded bit string to an encoded bit string satisfying the condition of G=12 constraint between the encoded bit string and the right side bit string, when the data section is 13 bits by the second right-end-processing encoder.
Figure 20:
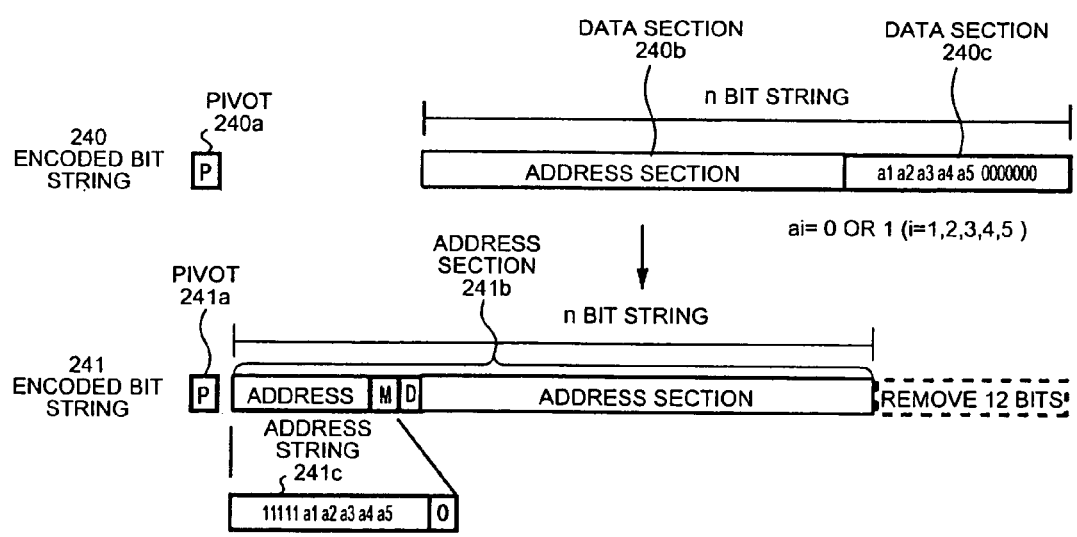
FIG. 20 is a schematic for illustrating conversion of an encoded bit string to an encoded bit string satisfying the condition of G=12 constraint between the encoded bit string and the right encoded bit string, when the data section is 12 bits by the second right-end-processing encoder.

With reference to FIGS. 18 to 20, an example in which the second right-end-processing encoder 105i shown in FIG. 10 converts an encoded bit string to an encoded bit string satisfying the condition of r=6 constraint, or the condition of G=12 constraint between the encoded bit string and the right encoded bit string will be explained.

FIG. 18 depicts an example in which the second right-end-processing encoder 105i converts an encoded bit string to an encoded bit string satisfying the condition of G=12 constraint between the encoded bit string and the right encoded bit string, when the data section is larger than 13 bits.

FIG. 19 depicts an example in which the second right-end-processing encoder 105i converts an encoded bit string to an encoded bit string satisfying the condition of G=12 constraint between the encoded bit string and the right encoded bit string, when the data section is 13 bits.

FIG. 20 depicts an example in which the second right-end-processing encoder 105i converts an encoded bit string to an encoded bit string satisfying the condition of G=12 constraint between the encoded bit string and the right encoded bit string, when the data section is 12 bits.

As shown in FIG. 18, when a data section 220c in an encoded bit string 220 is larger than 13 bits, the second right-end-processing encoder 105i extracts a 14-bit bit string at the right end of the encoded bit string 220, performs right-end-processing for substituting the extracted bit string by an address string 221d in which the first half 7 bits of the extracted 14 bits are left, and adds "11" bit to the last bit of the encoded bit string 220.

On the other hand, as shown in FIG. 19, when a data section 230c in an encoded bit string 230 is 13 bits, the second right-end-processing encoder 105i extracts a 13-bit bit string at the right end of the encoded bit string 230, performs right-end-processing for substituting the extracted bit string by an address string 231c in which the first 6 bits of the extracted 13 bits are left, and adds "1" bit to the last bit of the encoded bit string 230.

As shown in FIG. 20, when a data section 240c in an encoded bit string 240 is 12 bits, the second right-end-processing encoder 105i extracts a 12-bit bit string at the right end of the encoded bit string 240, and performs right-end-processing for substituting the extracted bit string by an address string 241c in which the first 5 bits of the extracted 12 bits are left.

By performing the right-end-processing, the second right-end-processing encoder 105i can convert an encoded bit string to an encoded bit string satisfying the condition of G=12 constraint between the encoded bit string and the right encoded bit string.

Figure 21:
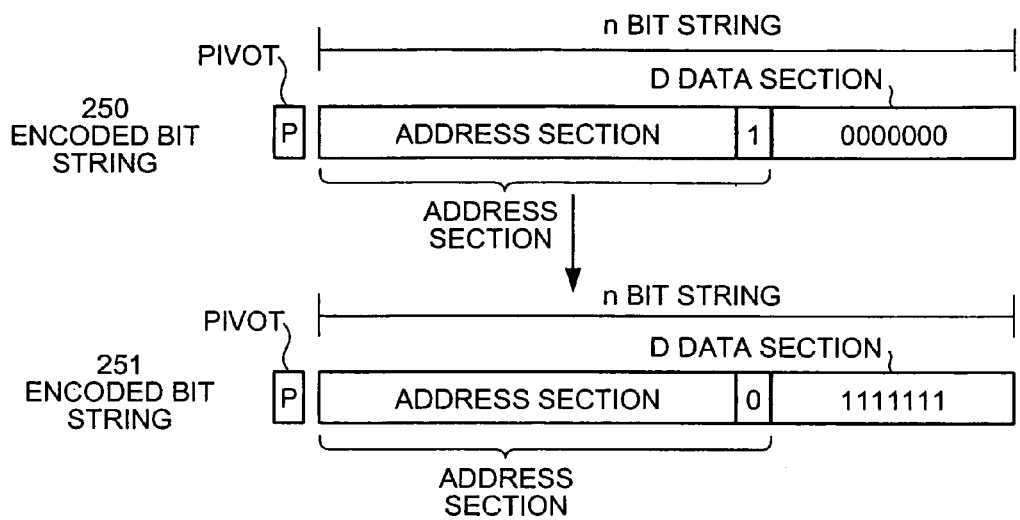
FIG. 21 is a schematic for illustrating another right-end-processing by the second right-end-processing encoder.

Another example of the right-end-processing by the second right-end-processing encoder 105i shown in FIG. 10 will be explained with reference to FIG. 21. FIG. 21 is a diagram of another example of the right-end-processing by the second right-end-processing encoder 105i.

As shown in FIG. 21, when the data section is less than 12 bits and violates the condition of r=6 constraint, the second right-end-processing encoder 105i performs the right-end-processing for substituting "0" bit in 0 run (where "0" is continuous) by "1" bit, by changing the value of delimiter in the right address string in encoded bit string.

For example, when the bit length of an encoded bit string 250 is n=523 bits, and the bit length of the address string is 12 bits, the bit length of the data section in the encoded bit string 250 can be 7 bits. Therefore, if the second right-end-processing encoder 105i extracts 12-bit bit string, as shown in FIGS. 18 to 20, the second right-end-processing encoder 105i has to extract a part of the address section.

To avoid this, when the data section is less than 12 bits and violates the condition of r=6 constraint, the second right-end-processing encoder 105i changes the value of delimiter in the left address string in the data section from "1" to "0", and performs the right-end-processing for substituting the data section formed of seven "0" bits by a data section formed of seven "1" bits.

Figure 22:
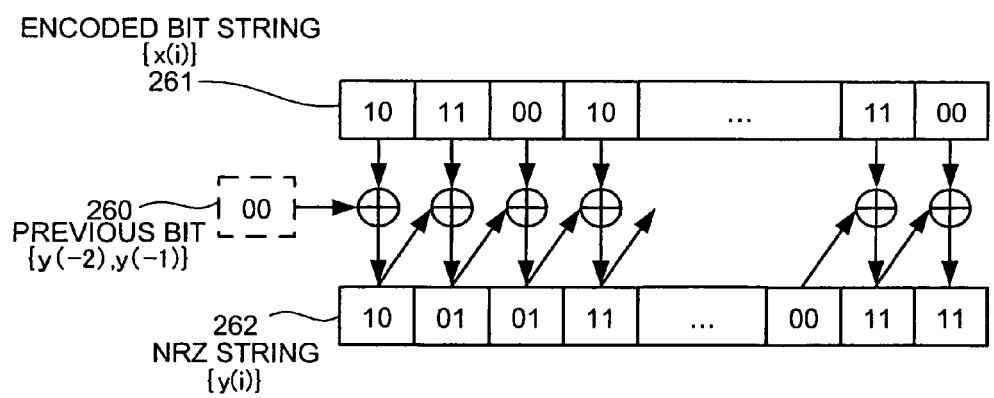
FIG. 22 is a schematic for illustrating a $1/(1+D^2)$ processing.

The precoder 105j is an encoder that performs $1/(1+D^2)$ processing for converting an encoded bit string to an NRZ string. FIG. 22 is an explanatory diagram of the $1/(1+D^2)$ processing.

In the $1/(1+D^2)$ processing, the following recurrence equation is used to convert an encoded bit string 261 $\{x(i)\}$ to an NRZ string 262 $\{y(i)\}$:

$$y(i)=x(i)+y(i-2)$$

where $y(-2)=y(-1)=0$.

Specifically, as shown in FIG. 22, the NRZ string 262 $\{y(i)\}$ is calculated by performing EOR calculation, using the previous bit 260 ($y(-2)=y(-1)=0$) and the encoded bit string 261 $\{x(i)\}$.

The configuration of the HR-RLL encoder 105 has been explained. In the HR-RLL encoder 105, a bit string that does not violate the condition of G constraint or the condition of I constraint is directly output without performing RLL encoding.

When the GS encoder 104 converts a random bit string to a scrambled string, violation of the condition of G constraint or the condition of I constraint hardly occurs.

Therefore, by constituting the HR-RLL encoder 105 in the above manner, a bit string with suppressed DC-component can be recorded in the hard disk drive in the DC-component suppressed state.

In the conventional guided scrambling method, it is necessary to provide the HR-RLL encoder 105 for the respective scrambled strings calculated by the GS encoder 104. According to the first embodiment, however, only one HR-RLL encoder 105 is necessary, thereby reducing the circuit size.

Figure 23:
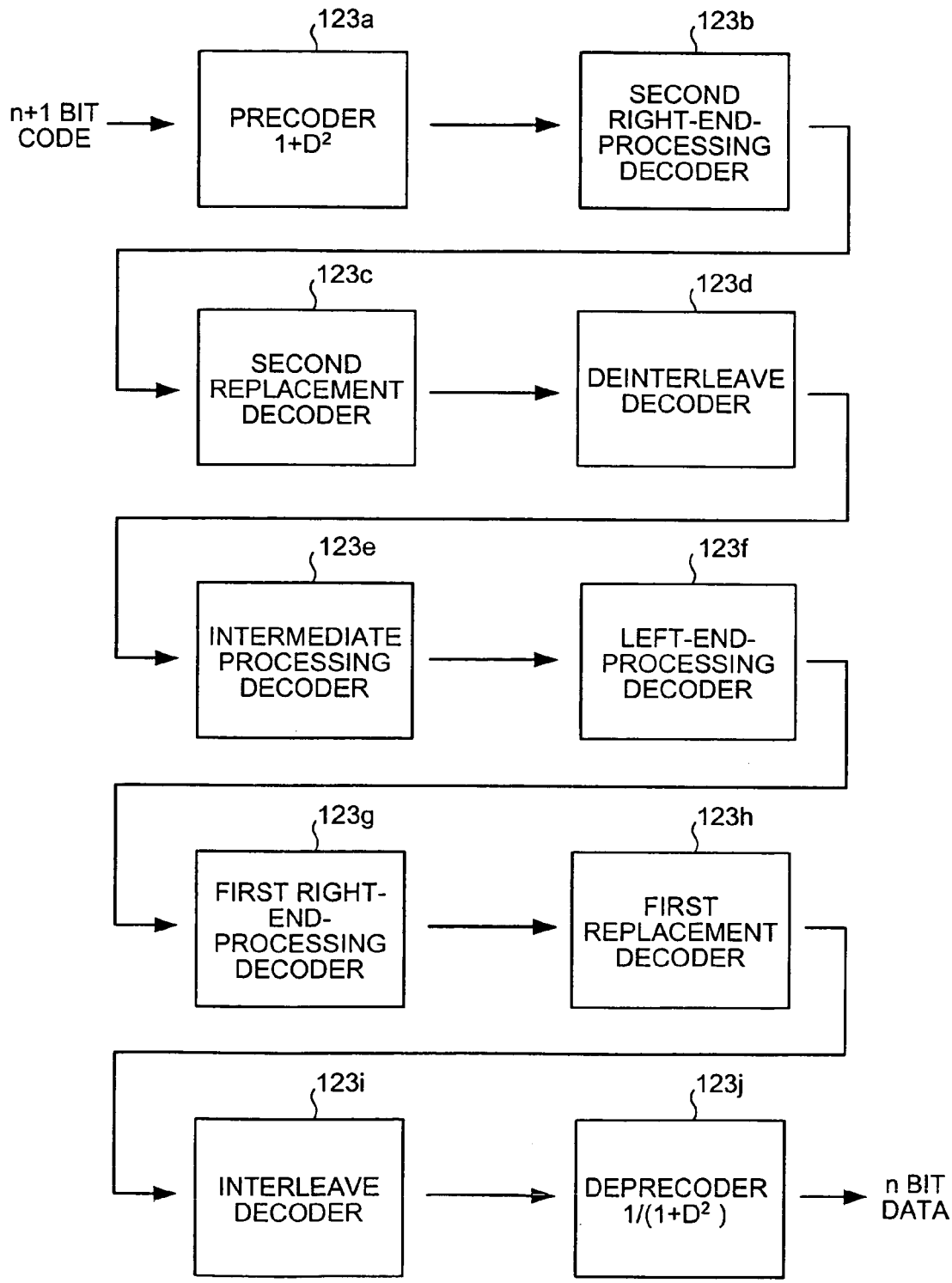
FIG. 23 is a block diagram of an HR-RLL decoder.

The configuration of the HR-RLL decoder 123 shown in FIG. 1 will be explained with reference to FIG. 23. FIG. 23 is a functional block diagram of the configuration of the HR-RLL decoder 123.

The HR-RLL decoder 123 has a high code rate, which converts an encoded bit string of n=524 bits satisfying the condition of RLL constraint to an information bit string of n=523 bits.

The HR-RLL decoder 123 has a precoder 123a, a second right-end-processing decoder 123b, a second replacement decoder 123c, a deinterleave decoder 123d, an intermediate processing decoder 123e, a left-end-processing decoder 123f, a first right-end-processing decoder 123g, a first replacement decoder 123h, an interleave decoder 123i, and a deprecoder 123j.

The precoder 123a is a decoder that converts an NRZ string of n=524 bits to an encoded bit string. The precoder 123a converts the NRZ string to an encoded bit string according to the method explained with reference to FIG. 11.

The second right-end-processing decoder 123b, the second replacement decoder 123c, the deinterleave decoder 123d, the intermediate processing decoder 123e, the left-end-processing decoder 123f, the first right-end-processing decoder 123g, the first replacement decoder 123h, and the interleave decoder 123i are, respectively a decoder that converts an encoded bit string of n=524 bits to an information bit string of n=523 bits.

The decoding processing of these decoders can be performed by following backwards the encoding processing of the encoders, and hence, the explanation thereof is omitted.

The deprecoder 123j is a decoder that converts the NRZ string of n=523 bits to an encoded bit string. The deprecoder 123j converts an NRZ string to an encoded bit string according to the method explained with reference to FIG. 22.

Figure 24:
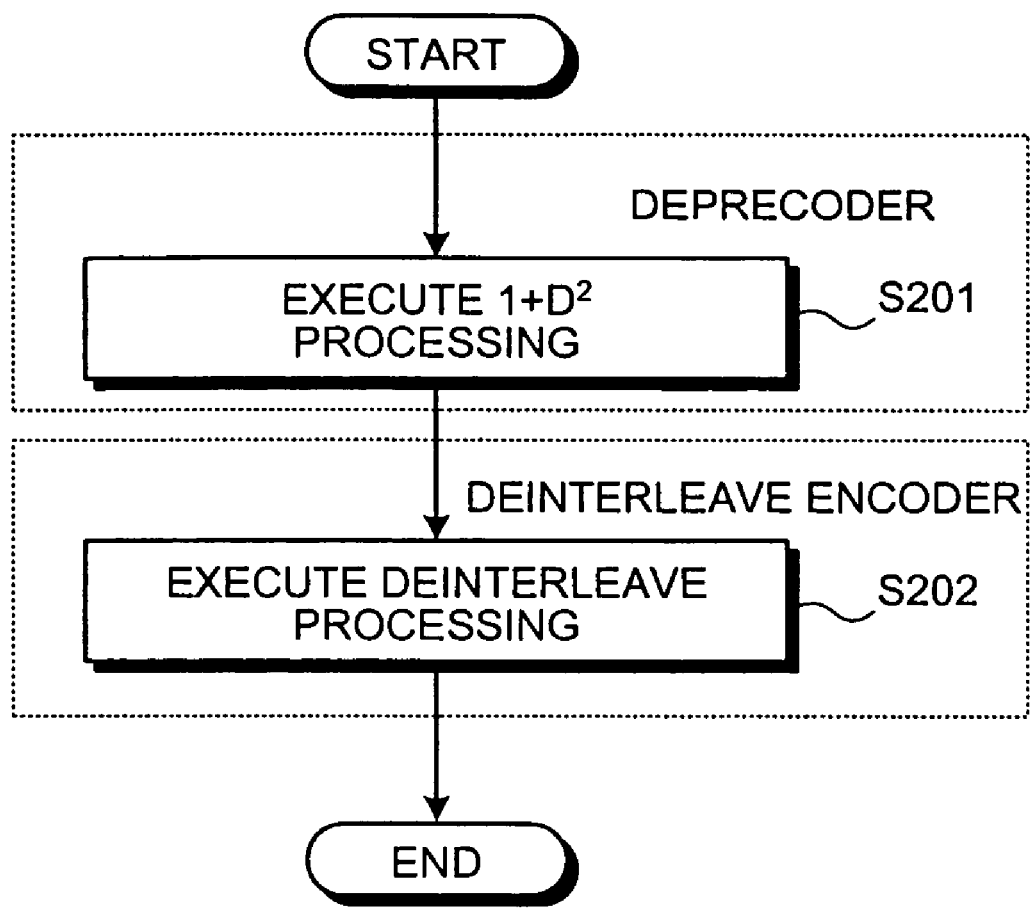
FIG. 24 is a flowchart of the encoding processing performed by a deprecoder and a deinterleave encoder in the HR-RLL encoder.

The processing procedure of encoding processing performed by the HR-RLL encoder 105 shown in FIG. 1 will be explained with reference to FIGS. 24 to 29. FIG. 24 is a flowchart of the processing procedure of the encoding processing performed by the deprecoder 105a and the deinterleave encoder 105b in the HR-RLL encoder 105.

As shown in FIG. 24, the deprecoder 105a executes the $1+D^2$ processing (step S202) to convert an NRZ string to an encoded bit string; as shown in FIG. 11.

The deinterleave encoder 105b then executes the deinterleave processing as shown in FIG. 12 (step S202).

Figure 25:
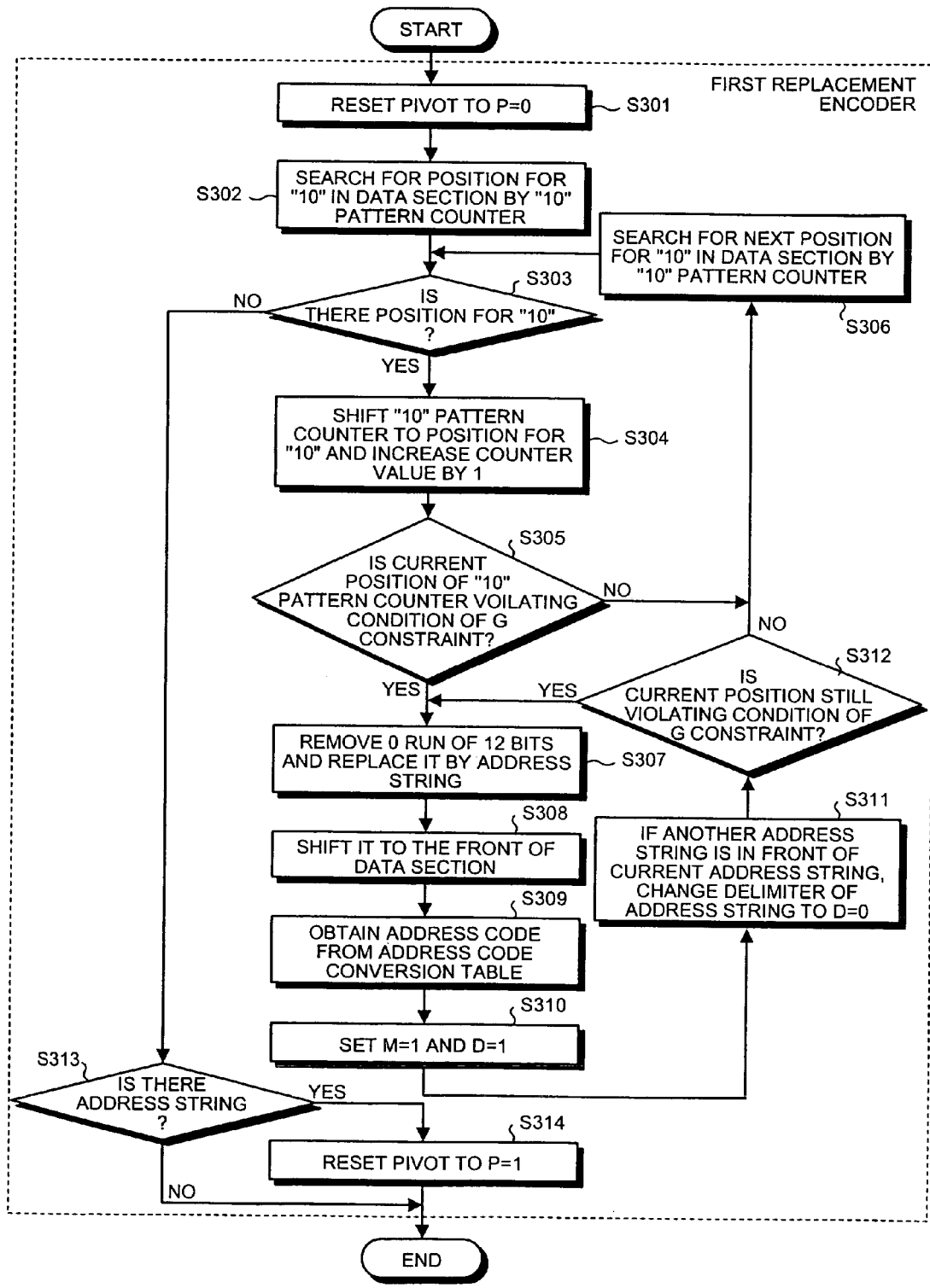
FIG. 25 is a flowchart of the encoding processing performed by the first replacement encoder in the HR-RLL encoder.

FIG. 25 is a flowchart of the processing procedure of the encoding processing performed by the first replacement encoder 105c in the HR-RLL encoder 105.

As shown in FIG. 25, the first replacement encoder 105c sets a pivot P at the head of an encoded bit string, to reset the pivot to P=0 (step S301), and searches for a position for "10" in a data section by a "10" pattern counter (step S302).

The first replacement encoder 105c then checks if there is a position for "10" (step S303). Accordingly, when there is the position for "10" ("YES" at step S303), the first replacement encoder 105c shifts the "10" pattern counter to the position for "10", and increases the counter value by 1 (step S304).

The first replacement encoder 105c then checks if the current position of the "10" pattern counter violates the condition of G constraint (step S305). Accordingly, when the current position of the "10" pattern counter does not violate the condition of G constraint ("NO" at step S305), the first replacement encoder 105c searches for the next position for "10" in the data section using the "10" pattern counter (step S306).

On the other hand, when the current position of the "10" pattern counter violates the condition of G constraint ("YES" at step S305), the first replacement encoder 105c removes the 0 run of 12 bits and replaces it by an address string (step S307), to shift it to the front of the data section (step S308).

The first replacement encoder 105c obtains an address code from the address code conversion table (step S309), and sets the marker M=1, and the delimiter D=1 (step S310). Furthermore, if there is another address in front of the current address string, the first replacement encoder 105c changes the delimiter D of the address string to 0 (step S311).

The first replacement encoder 105c then checks if the current position is still violating the condition of G constraint (step S312). Accordingly, when the current position is still violating the condition of G constraint ("YES" at step S312), the first replacement encoder 105c returns to step S307 to repeat the procedure of from step S307 to step S311.

On the other hand, when the current position is not violating the condition of G constraint ("NO" at step S312), the first replacement encoder 105c returns to step S306.

On the other hand, when there is no position for "10" ("NO" at step S303), the first replacement encoder 105c further checks if there is an address string in the encoded bit string (step S313).

Accordingly, when there is an address string in the encoded bit string ("YES" at step S313), the first replacement encoder 105c resets the pivot to P=1 (step S314). On the other hand, when there is no address string in the encoded bit string ("NO" at step S313), the first replacement encoder 105c finishes this processing.

Figure 26:
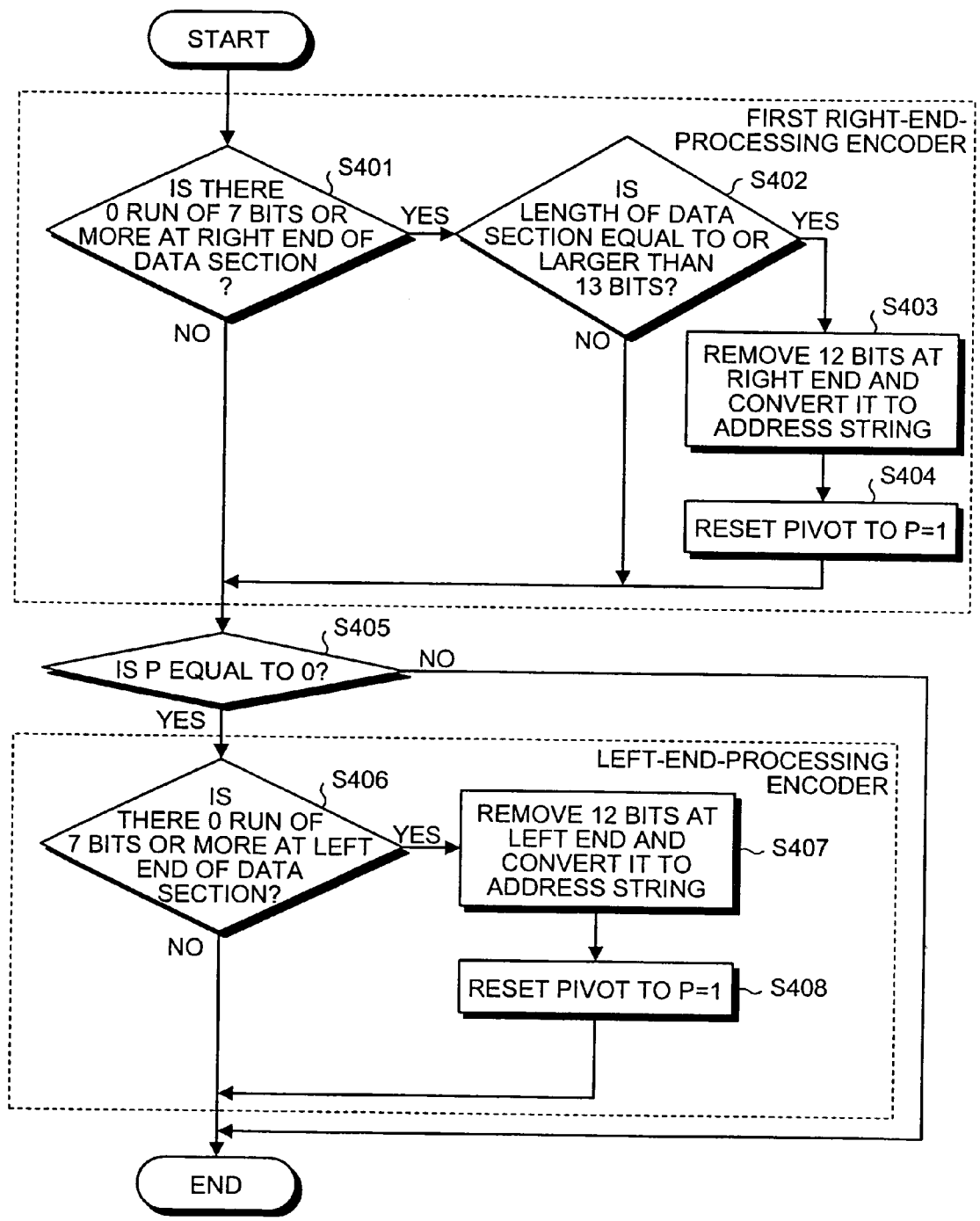
FIG. 26 is a flowchart of the encoding processing performed by the first right-end-processing encoder and the left-end-processing encoder in the HR-RLL encoder.

FIG. 26 is a flowchart of the processing procedure of the encoding processing performed by the first right-end-processing encoder 105d and the left-end-processing encoder 105e in the HR-RLL encoder 105.

As shown in FIG. 26, the first right-end-processing encoder 105d checks if there is a 0 run of 7 bits or more at the right end of the data section in the encoded bit string (step S401). Accordingly, when there is no 0 run of 7 bits or more at the right end of the data section in the encoded bit string ("NO" at step S401), the first right-end-processing encoder 105d proceeds to step S405.

On the other hand, when there is a 0 run of 7 bits or more at the right end of the data section in the encoded bit string ("YES" at step S401), the first right-end-processing encoder 105d further checks if the length of the data section in the encoded bit string is equal to or larger than 13 bits (step S402).

Accordingly, when the length of the data section in the encoded bit string is less than 13 bits ("NO" at step S402), the first right-end-processing encoder 105d proceeds to step S405.

On the other hand, when the length of the data section in the encoded bit string is equal to or longer than 13 bits ("YES" at step S402), the first right-end-processing encoder 105d removes 12 bits at the right end as explained with reference to FIG. 14, and converts it to an address string (step S403). The first right-end-processing encoder 105d resets the pivot to P=1 (step S404).

The left-end-processing encoder 105e checks if the pivot in the encoded bit string is P=0 (step S405). Accordingly, when the pivot in the encoded bit string is not P=0 ("NO" at step S405), the left-end-processing encoder 105e finishes the processing without performing the left-end-processing.

On the other hand, when the pivot in the encoded bit string is P=0 ("YES" at step S405), the left-end-processing encoder 105e further checks if there is a 0 run of 7 bits or more at the left end of the data section in the encoded bit string (step S406).

Accordingly, when there is no 0 run of 7 bits or more at the left end of the data section in the encoded bit string ("NO" at step S406), the left-end-processing encoder 105e finishes the processing.

On the other hand, when there is a 0 run of 7 bits or more at the left end of the data section in the encoded bit string ("YES" at step S406), the left-end-processing encoder 105e removes 12 bits at the left end of the encoded bit string and converts it to an address string as explained with reference to FIG. 15 (step S407).

The left-end-processing encoder 105e resets the pivot in the encoded bit string to P=1 (step S408), and finishes the processing.

Figure 27:
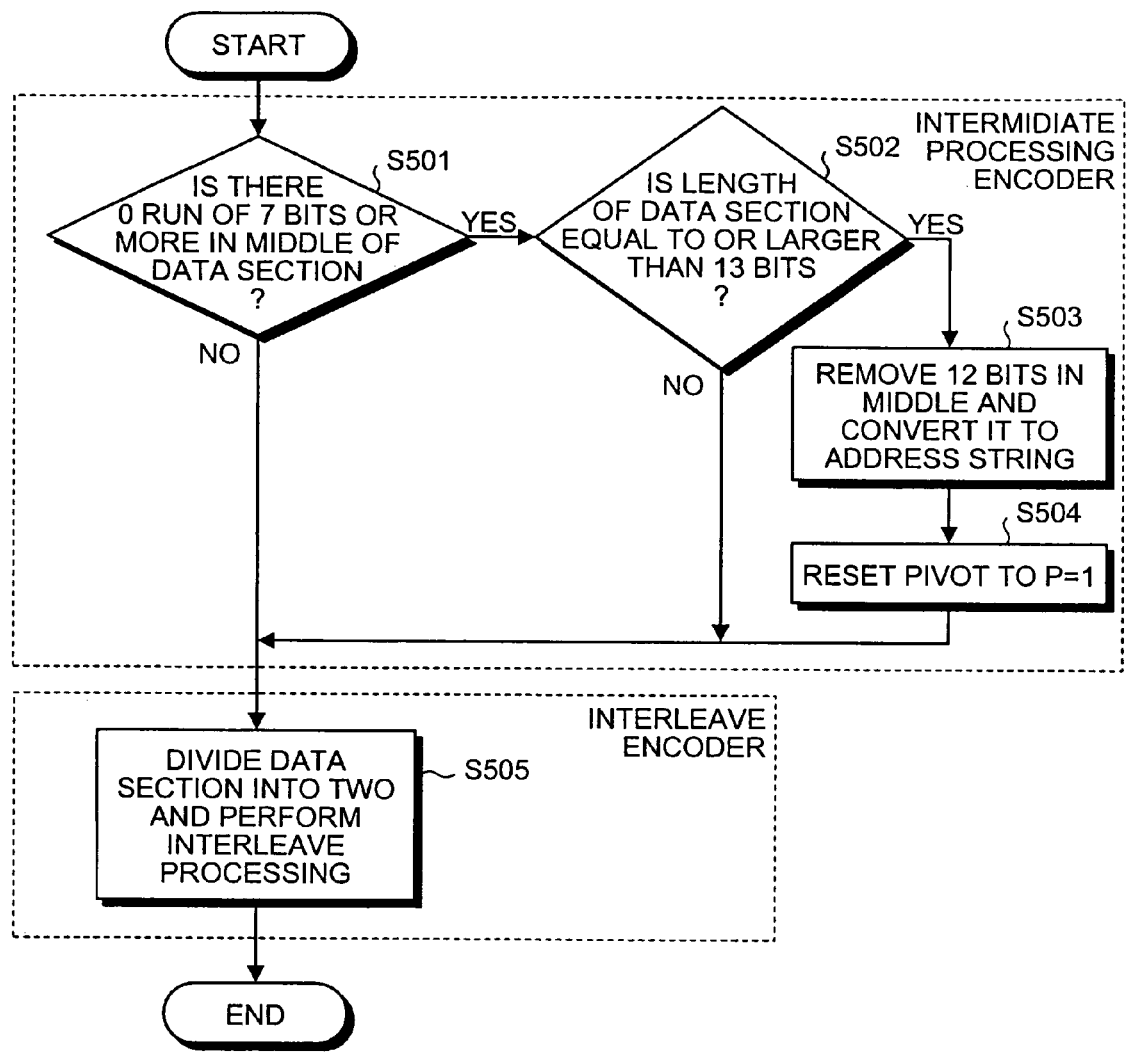
FIG. 27 is a flowchart of the encoding processing performed by the intermediate processing encoder and the interleave encoder in the HR-RLL encoder.

FIG. 27 is a flowchart of the processing procedure of the encoding processing performed by the intermediate processing encoder 105f and the interleave encoder 105g in the HR-RLL encoder 105.

As shown in FIG. 27, the intermediate processing encoder 105f checks if there is a 0 run 7 bits or more in the middle of the data section in the encoded bit string (step S501). Accordingly, when there is no 0 run 7 bits or more in the middle of the data section in the encoded bit string ("NO" at step S501), the intermediate processing encoder 105f proceeds to step S505.

On the other hand, when there is a 0 run 7 bits or more in the middle of the data section in the encoded bit string ("YES" at step S501), the intermediate processing encoder 105f further checks if the length of the data section in the encoded bit string is equal to or larger than 13 bits (step S502).

Accordingly, when the length of the data section in the encoded bit string is less than 13 bits ("NO" at step S502), the intermediate processing encoder 105f proceeds to step S505.

On the other hand, when the length of the data section in the encoded bit string is equal to or longer than 13 bits ("YES" at step S502), the intermediate processing encoder 105f removes 12 bits in the middle of the data section, and converts it to an address string (step S503). The intermediate processing encoder 105f then resets the pivot to P=1 (step S504).

The interleave encoder 105g divides the data section in the encoded bit string into two, as explained with reference to FIG. 17, and performs interleave processing (step S505).

Figure 28:
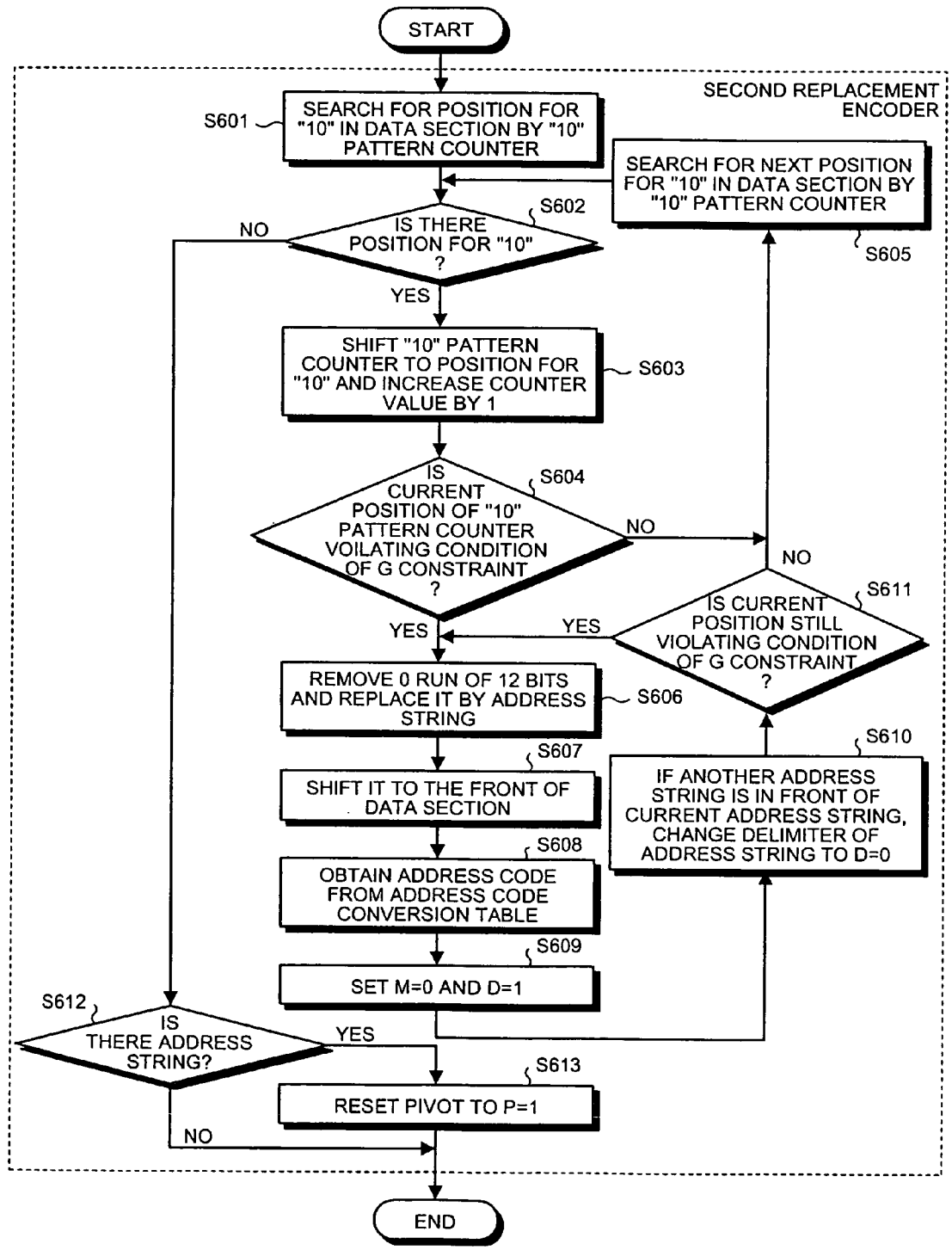
FIG. 28 is a flowchart of the encoding processing performed by a second replacement encoder in the HR-RLL encoder.

FIG. 28 is a flowchart of the processing procedure of the encoding processing performed by the second replacement encoder 105h in the HR-RLL encoder 105.

As shown in FIG. 28, the second replacement encoder 105h searches for a position for "10" in the data section by the "10" pattern counter (step S601). The second replacement encoder 105h then checks if there is the position for "10" (step S602).

When there is the position for "10" ("YES" at step S602), the second replacement encoder 105h shifts the "10" pattern counter to the position for "10", and increases the counter value by 1 (step S604).

The second replacement encoder 105h then checks if the current position of the "10" pattern counter violates the condition of G constraint (step S604). Accordingly, when the current position of the "10" pattern counter does not violate the condition of G constraint ("NO" at step S604), the second replacement encoder 105h searches for the next position for "10" in the data section by the "10" pattern counter (step S605).

On the other hand, when the current position of the "10" pattern counter violates the condition of G constraint ("YES" at step S604), the second replacement encoder 105h removes the 0 run of 12 bits and replaces it by an address string (step S606), to shift it to the front of the data section (step S607).

The second replacement encoder 105h obtains an address code from the address code conversion table (step S608), and sets the marker M=0, and the delimiter D=1 (step S609). Furthermore, if there is another address in front of the current address string, the second replacement encoder 105h changes the delimiter D of the address string to 0 (step S610).

The second replacement encoder 105h then checks if the current position is still violating the condition of G constraint (step S611). Accordingly, when the current position is still violating the condition of G constraint ("YES" at step S611), the second replacement encoder 105h returns to step S606 to repeat the procedure of from step S606 to step S610.

On the other hand, when the current position is not violating the condition of G constraint ("NO" at step S611), the second replacement encoder 105h returns to step S605.

On the other hand, when there is no position for "10" ("NO" at step S602), the second replacement encoder 105h further checks if there is an address string in the encoded bit string (step S612).

Accordingly, when there is an address string in the encoded bit string ("YES" at step S612), the second replacement encoder 105h resets the pivot to P=1 (step S613). On the other hand, when there is no address string in the encoded bit string ("NO" at step S612), the second replacement encoder 105h finishes this processing.

Figure 29:
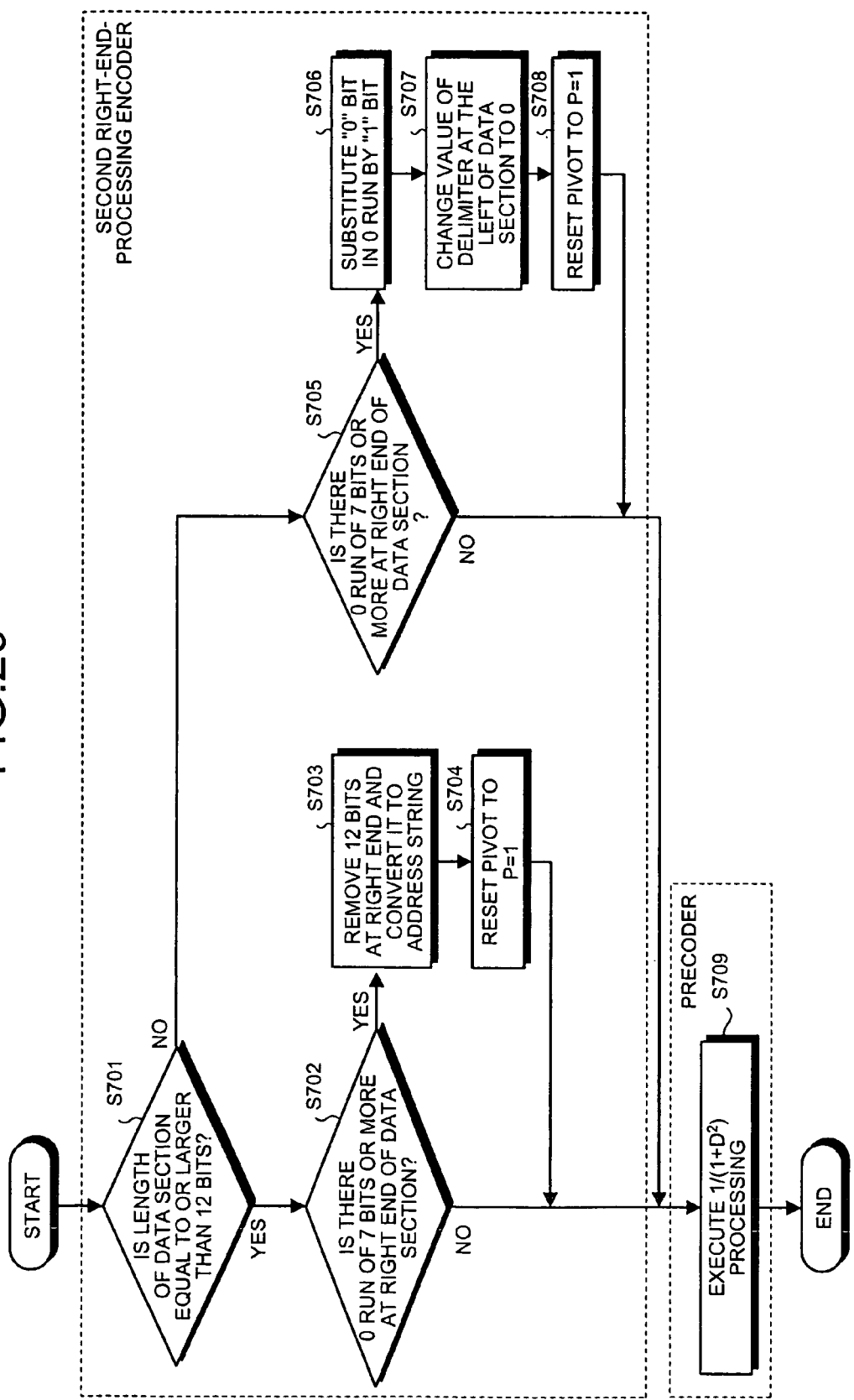
FIG. 29 is a flowchart of the encoding processing performed by the second right-end-processing encoder and a precoder in the HR-RLL encoder.

FIG. 29 is a flowchart of the processing procedure of the encoding processing performed by the second right-end-processing encoder 105i and the precoder 105j in the HR-RLL encoder 105.

As shown in FIG. 29, the second right-end-processing encoder 105i checks if the length of the data section in the encoded bit string is equal to or larger than 12 bits (step S701).

Accordingly, when the length of the data section in the encoded bit string is equal to or longer than 12 bits ("YES" at step S701), the second right-end-processing encoder 105i checks if there is a 0 run of 7 bits or more at the right end of the data section in the encoded bit string (step S702).

Accordingly, when there is a 0 run of 7 bits or more at the right end of the data section in the encoded bit string ("YES" at step S702), the second right-end-processing encoder 105i removes 12 bits at the right end of the encoded bit string, converts it to an address string (step S703), and resets the pivot to P=1 (step S704), to proceed to step S709.

On the other hand, when there is no 0 run of 7 bits or more at the right end of the data section in the encoded bit string ("NO" at step S702), the second right-end-processing encoder 105i proceeds to step S709.

On the other hand, when the length of the data section in the encoded bit string is less than 12 bits ("NO" at step S701), the second right-end-processing encoder 105i further checks if there is 0 run of 7 bits or more at the right end of the data section in the encoded bit string (step S705).

Accordingly, when there is no 0 run of 7 bits or more at the right end of the data section in the encoded bit string ("NO" at step S705), the second right-end-processing encoder 105i proceeds to step S709.

On the other hand, when there is a 0 run of 7 bits or more at the right end of the data section in the encoded bit string ("YES" at step S705), the second right-end-processing encoder 105i performs the right-end-processing for substituting the "0" bit of the 0 run by "1" bit, as explained with reference to FIG. 21 (step S706).

Furthermore, the second right-end-processing encoder 105i changes the value of the delimiter on the left side of the data section to "0" (step S707), and resets the pivot to P=1 (step S708).

Thereafter, the precoder 105j executes the $1/(1+D^2)$ processing as explained with reference to FIG. 22 (step S709), to finish the processing.

The processing procedure of the decoding processing performed by the HR-RLL decoder 123 shown in FIG. 1 will be explained with reference to FIGS. 30 to 32.

Figure 30:
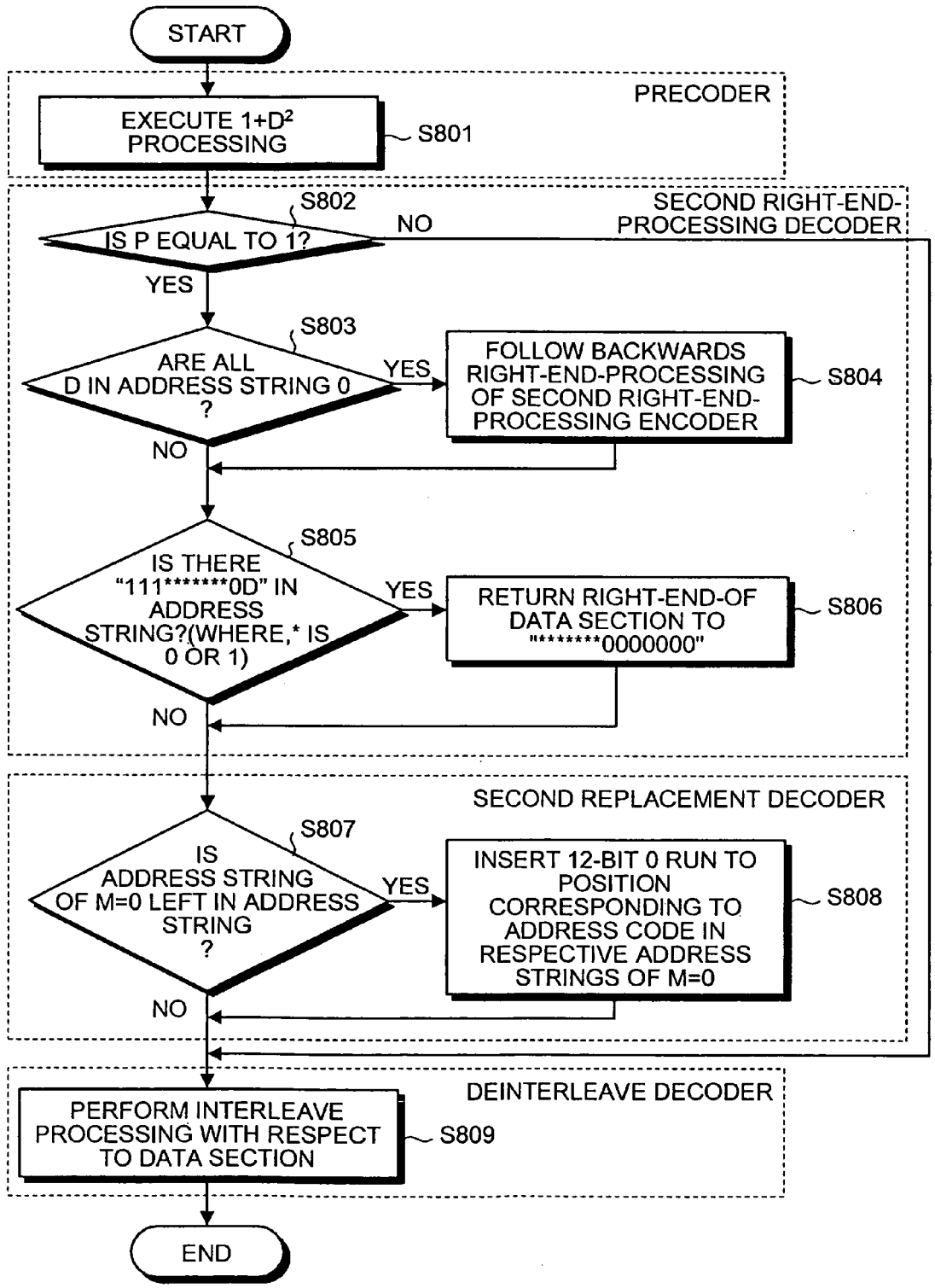
FIG. 30 is a flowchart of the decoding processing by a precoder, a second right-end-processing decoder, a second replacement decoder, and a deinterleave decoder in the HR-RLL decoder.

FIG. 30 is a flowchart of the processing procedure of the decoding processing by the precoder 123a, the second right-end-processing decoder 123b, the second replacement decoder 123c, and the deinterleave decoder 123d in the HR-RLL decoder 123.

As shown in FIG. 30, the precoder 123a first executes the $1+D^2$ processing as explained with reference to FIG. 11 (step S801).

The second right-end-processing decoder 123b checks if the pivot in the encoded bit string is P=1 (step S802). Accordingly, when the pivot in the encoded bit string is P=0 ("NO" at step S802), the second right-end-processing decoder 123b proceeds to step S809.

On the other hand, when the pivot in the encoded bit string is P=1 ("YES" at step S802), the second right-end-processing decoder 123b checks if all delimiters D in the address string in the encoded bit string are "0" (step S803).

Accordingly, when the delimiters D in the address string in the encoded bit string are all "0" ("YES" at step S803), the second right-end-processing decoder 123b follows backwards the conversion in the right-end-processing performed by the second right-end-processing encoder 105i, as explained with reference to FIG. 21, to return the data section to the original state (step S804).

On the other hand, when all the delimiters D in the address string in the encoded bit string are not "0" ("NO" at step S803), the second right-end-processing decoder 123b checks if there is "111*******0D" in the address string in the encoded bit string (step S805). Here, "*" is "0" or Accordingly, when there is "111*******0D" in the address string in the encoded bit string ("YES" at step S805), the second right-end-processing decoder 123*b* returns the right end of the encoded bit string to "********0000000" (step S806).

On the other hand, when there is no "111*******0D" in the address string in the encoded bit string ("NO" at step S805), the second replacement decoder 123*c* checks if an address of M=0 still remains in the address string in the encoded bit string (step S807).

Accordingly, when an address of M=0 still remains in the address string in the encoded bit string ("YES" at step S807), the second replacement decoder 123*c* inserts 0 run of 12 bits to a position corresponding to the address code of the respective address strings of M=0 (step S808).

On the other hand, when an address of M=0 is not left in the address string in the encoded bit string ("NO" at step S807), the deinterleave decoder 123*d* performs interleave processing for the data section of the encoded bit string as explained with reference to FIG. 17 (step S809).

Figure 31:
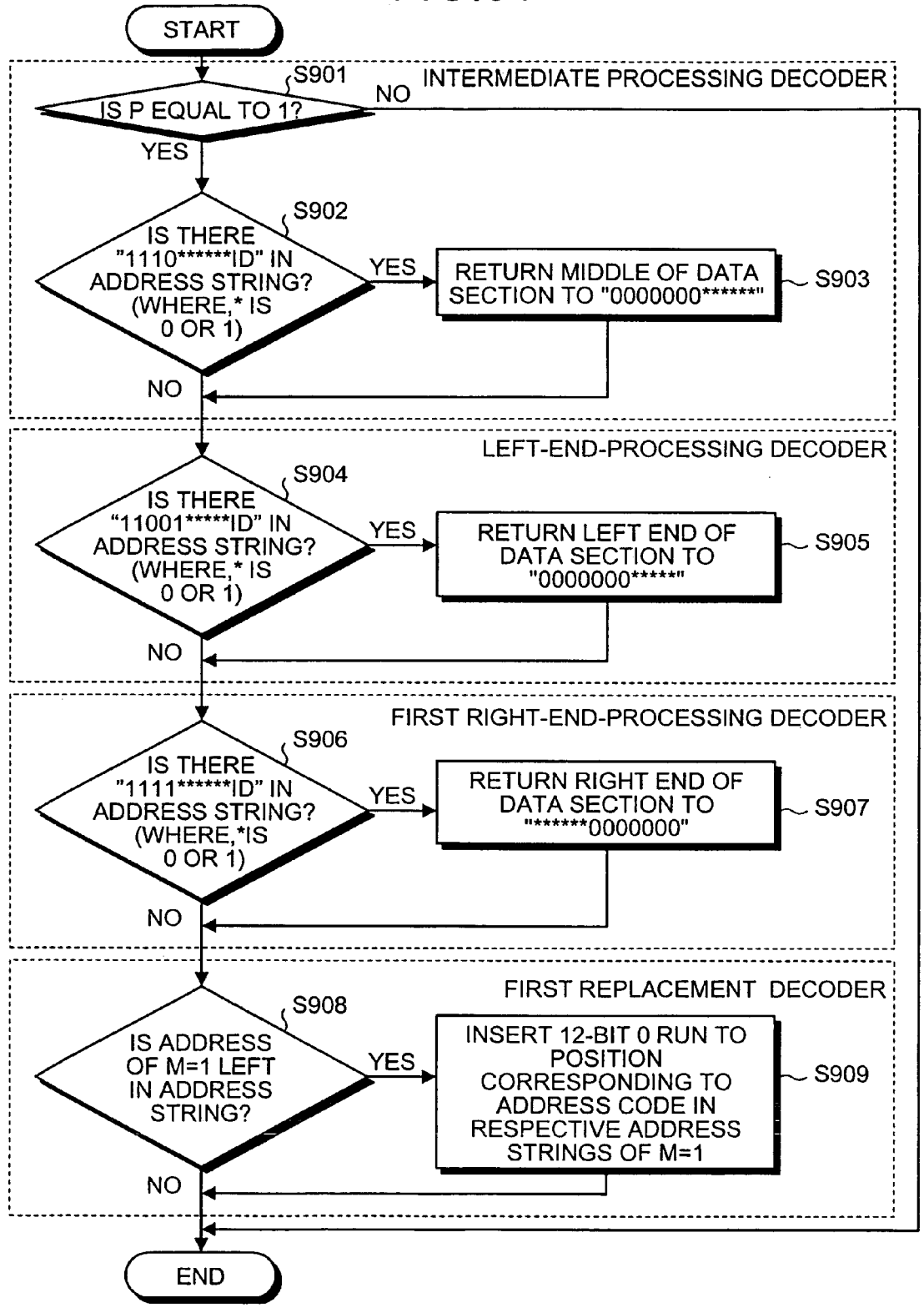
FIG. 31 is a flowchart of the decoding processing by an intermediate processing decoder, a left-end-processing decoder, a first right-end-processing decoder, and a first replacement decoder in the HR-RLL decoder.

FIG. 31 is a flowchart of the processing procedure of the decoding processing by the intermediate processing decoder 123*e*, the left-end-processing decoder 123*f*, the first right-end-processing decoder 123*g*, and the first replacement decoder 123*h*, in the HR-RLL decoder 123.

As shown in FIG. 31, the intermediate processing decoder 123*e* first checks if the pivot in the encoded bit string is P=1 (step S901). Accordingly, when the pivot in the encoded bit string is P=0 ("NO" at step S901), the intermediate processing decoder 123*e* finishes the processing.

On the other hand, when the pivot in the encoded bit string is P=1 ("YES" at step S901), the intermediate processing decoder 123*e* checks if there is "1110******1D" in the address string in the encoded bit string (step S902). Here, "*" is "0" or "1".

Accordingly, when there is "1110******1D" in the address string in the encoded bit string (step S902), the intermediate processing decoder 123*e* returns the state of the middle part in the data section in the encoded bit string to "0000000******" (step S903).

On the other hand, when there is no "1110******1D" in the address string in the encoded bit string ("NO" at step S902), the left-end-processing decoder 123*f* further checks if there is "11001*****1D" in the address string in the encoded bit string (step S904).

Accordingly, when there is "11001*****1D" in the address string in the encoded bit string ("YES" at step S904), the left-end-processing decoder 123*f* returns the state at the left end of the data section in the encoded bit string to "0000000*****" (step S905).

On the other hand, when there is no "11001*****1D" in the address string in the encoded bit string ("NO" at step S904), the first right-end-processing decoder 123*g* further checks if there is "1111******1D" in the address string in the encoded bit string (step S906).

Accordingly, when there is "1111******1D" in the address string in the encoded bit string ("YES" at step S906), the right-end-processing decoder 123*g* returns the state at the right end of the data section in the encoded bit string to "******0000000" (step S907).

On the other hand, when there is no "1111******1D" in the address string in the encoded bit string ("NO" at step S906), the first replacement decoder 123*h* further checks if an address of M=1 still remains in the address string in the encoded bit string (step S908).

Accordingly, when an address of M=1 still remains in the address string in the encoded bit string ("YES" at step S908), the first replacement decoder 123*h* inserts 0 run of 12 bits to a position corresponding to the address code of the respective address strings of M=1 (step S909).

On the other hand, when an address of M=1 is not left in the address string in the encoded bit string ("NO" at step S908), the first replacement decoder 123*h* finishes the processing.

Figure 32:
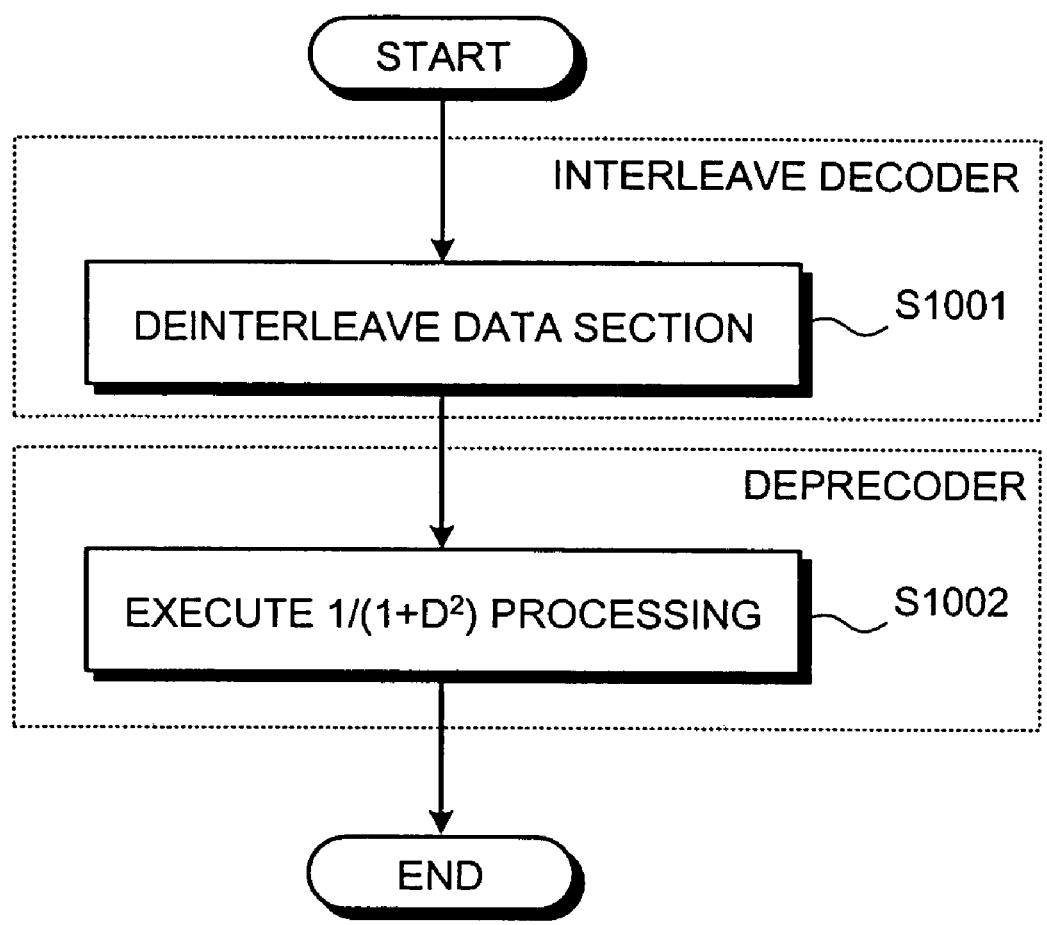
FIG. 32 is a flowchart of the decoding processing by an interleave decoder, and the deprecoder in the HR-RLL decoder.

FIG. 32 is a flowchart of the processing procedure of the decoding processing by the interleave decoder 123*i* and the deprecoder 123*j* in the HR-RLL decoder 123.

As shown in FIG. 32, the interleave decoder 123*i* deinterleaves the data section in the encoded bit string, as explained with reference to FIG. 12 (step S1001).

The deprecoder 123*j* executes the $1/(1+D^2)$ processing for converting the encoded bit string to an NRZ string (step S1002), to finish the processing.

According to the first embodiment, the GS encoder 104 generates a plurality of encoded bit strings by scrambling with respect to the input bit string, selects a bit string having a predetermined width in the generated bit strings, while shifting the bits one by one, to evaluate the DC components in the selected respective bit strings, and extracts the bit string with suppressed DC-component from the encoded bit strings based on the evaluation result.

Accordingly, even when the code rate is high, the DC components can be effectively suppressed to improve the error rate, by combining with a baseline correction. Furthermore, after the bit string with suppressed DC-component is extracted from the scrambled-bit strings, the bit string with suppressed DC-component is encoded by the HR-RLL encoder 105. Accordingly, it is not necessary to perform encoding for all scrambled-bit strings, as in the conventional guided scrambling method, thereby enabling a reduction of the circuit size.

Furthermore, according to the first embodiment, the GS encoder 104 adds 3-bit bit strings different from each other and "0" bit to the input bit string and performs scramble, to generate a plurality of encoded bit strings. When a bit string with suppressed DC-component is extracted, the GS encoder 104 removes the "0" bit from the extracted bit string and outputs the bit string. Therefore, the number of scrambled-bit strings can be reduced to half, thereby increasing the code rate.

Moreover, according to the first embodiment, the GS encoder 104 adds a parity bit for the post processor 108 to the bit string encoded by scrambling, and evaluates the DC component in the respective bit strings added with the parity bit. Accordingly, the DC component in the bit strings can be evaluated in the same state as that of the bit string when stored in the memory unit.

Furthermore, according to the first embodiment, the GS encoder 104 evaluates the DC component in the respective bit strings added with the parity bit for the post processor 108, and after having extracted the bit string with suppressed DC-component, removes the parity bit from the extracted bit string to output the bit string. Accordingly, by outputting the bit strings in the state without having the parity bit, the GS encoder 104 can perform encoding of the bit strings without affecting the post processor 108 added with the parity bit.

Moreover, according to the first embodiment, the GS encoder 104 evaluates the DC component in the respective bit strings by calculating the RDS value for the respective selected bit strings having a predetermined width, while shifting the bits one by one. Accordingly, by using the RDS value, the GS encoder 104 can perform effective evaluation of the DC component.

Furthermore, according to the first embodiment, the HR-RLL encoder 105 performs RLL encoding for the bit string with suppressed DC-component, after only a bit string with suppressed DC-component is extracted from the plurality of scrambled-bit strings. Accordingly, it is not necessary to perform the RLL encoding for all scrambled-bit strings, as in the conventional guided scrambling method. Accordingly, the circuit size can be reduced.

Moreover, according to the first embodiment, when the bit string satisfies the condition of G constraint and the condition of I constraint, the HR-RLL encoder 105 outputs the bit string without performing the RLL encoding. Accordingly, when the condition of constraint is satisfied, the HR-RLL encoder 105 can output the bit string in the DC-component suppressed state.

Furthermore, according to the first embodiment, the HR-RLL encoder 105 performs the RLL encoding of the bit string so as to dissolve a violation against the condition of G constraint. Accordingly, the HR-RLL encoder 105 can suppress error propagation in the bit string, thereby facilitating synchronization at the time of decoding the bit string.

Moreover, according to the first embodiment, the HR-RLL encoder 105 performs the RLL encoding of the bit string so as to further dissolve a violation against the condition of I constraint. Accordingly, error propagation in the bit string can be further suppressed.

Furthermore, according to the first embodiment, the HR-RLL encoder 105 adds "1" bit to a bit string when the bit string violates the condition of G constraint or the condition of I constraint, and adds "0" bit to the bit string when the bit string does not violate the condition of constraint. Accordingly, the HR-RLL encoder 105 can easily determine whether the bit string violates the condition of G constraint or the condition of I constraint, and when the bit string does not violate the condition of G constraint or the condition of I constraint, the HR-RLL encoder 105 can output the bit string in the DC-component suppressed state.

Moreover, according to the first embodiment, after the bit string with suppressed DC-component is output, the HR-RLL encoder 105 performs NRZ encoding and NRZ decoding of the bit string. Accordingly, by performing the above processing for the bit string with suppressed DC-component, when the bit string does not violate the condition of G constraint or the condition of I constraint, the HR-RLL encoder 105 can output the bit string in the DC-component suppressed state.

Furthermore, according to the first embodiment, since the bit string encoded by the GS encoder 104 or the HR-RLL encoder 105 is decoded, the encoded bit string with suppressed DC-component can be decoded.

FIG. 33 is a schematic for illustrating an outline of an encoder of a recording and reproducing apparatus 15 according to a second embodiment of the present invention. In the SDS calculation according to the first embodiment, a plurality of scrambled-bit strings are generated by performing scramble on the input string, the SDS window for each of the generated bit strings is shifted, for example, by one bit one after another, and the peak value of the RDS is updated for each of the RDS calculations for each of the bit shifts.

On the other hand, in a CSDS (condensed SDS) calculation according to the second embodiment, a CSDS window (for the purpose of explanation, the term CSDS window is used, but the CSDS window is essentially the same as the SDS window) is shifted, for example, by five bits one after another, and a peak value of the RDS is updated for every five bits, thereby simplifying the RDS calculation.

In the evaluation of the DC components according to the first embodiment, the SDS window is shifted by one bit one after another and the DC components of the bit string are evaluated for each of the bit shifts. In evaluation of the DC components according to the second embodiment, the CSDS window is shifted by five bits one after another, and the DC components of the bit string are evaluated for each of the 5-bit shifts, thereby simplifying processing with respect to the evaluation of the DC-components. Accordingly, an encoder according to the second embodiment can reduce a calculation amount substantially compared to the encoder according to the first embodiment (the GS encoder 104 shown in FIG. 1), while keeping a level of performance equivalent to that of the encoder according to the first embodiment.

In FIG. 33, the CSDS window is shifted by five bits one after another with respect to the bit string prior to the RDS calculation and the DC component evaluation, but the CSDS window can be shifted by any number of bits one after another prior to the RDS calculation and the DC component evaluation.

Figure 34:
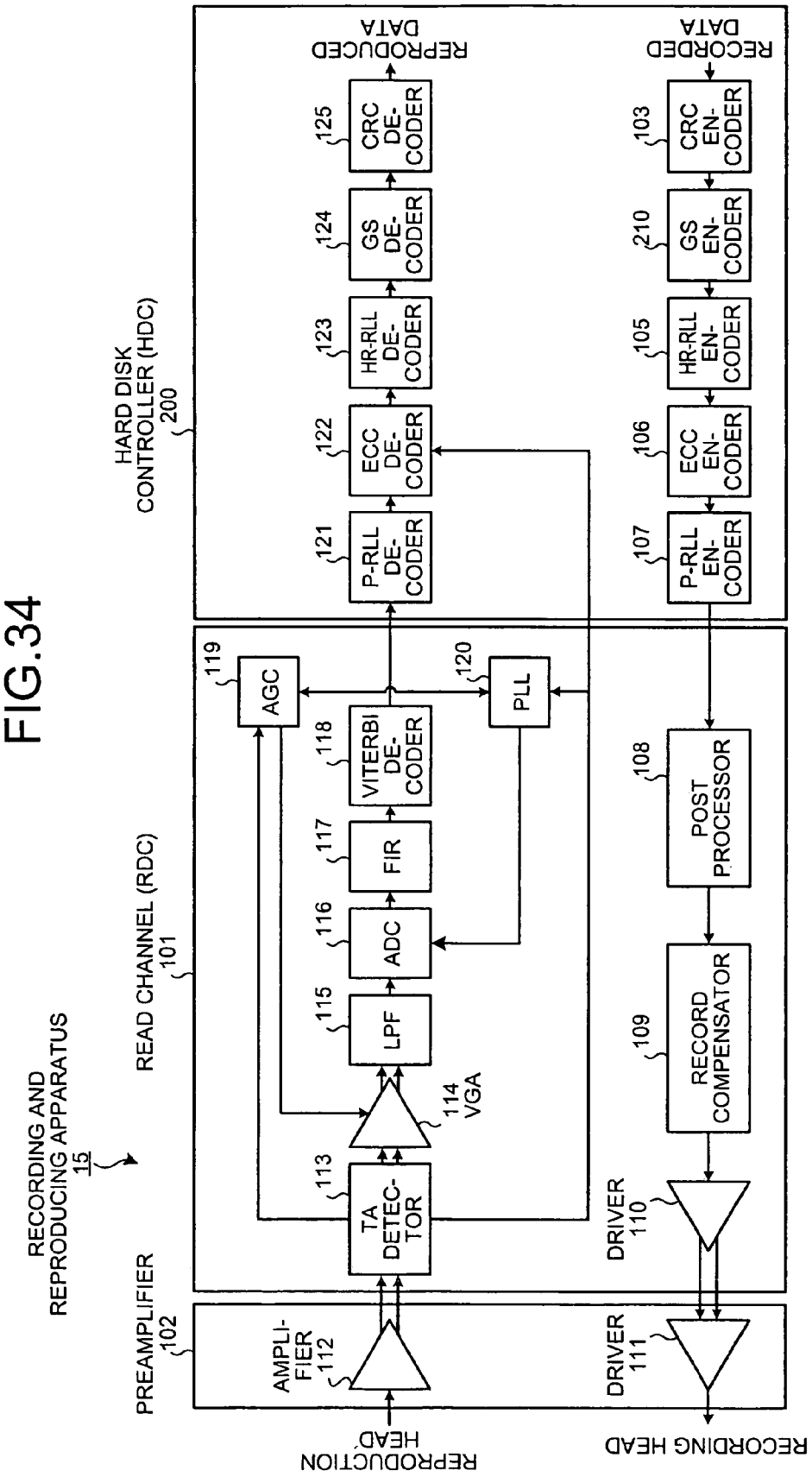
FIG. 34 is a block diagram of the recording and reproducing apparatus according to the second embodiment.

FIG. 34 is a block diagram of the recording and reproducing apparatus 15 according to the second embodiment. The recording and reproducing apparatus 15 according to the second embodiment includes an HDC 200. Other configurations and components are the same with the recording and reproducing apparatus 10 shown on the block diagram in FIG. 1, and accordingly these configurations and components are give the same reference numerals and their explanations are omitted. The HDC 200 includes, other than a GS encoder 210, the same components as the HDC 100 shown on the block diagram in FIG. 1, and accordingly these components are give the same reference numerals and their explanations are omitted.

Figure 35:
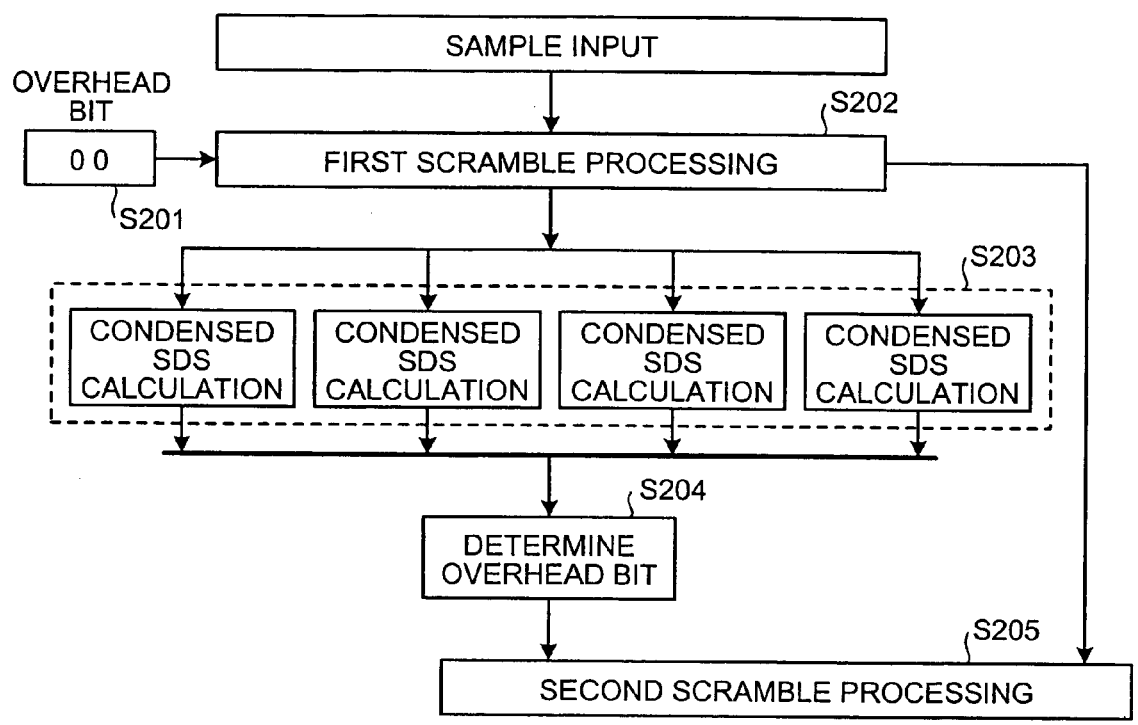
FIG. 35 is a schematic for illustrating a processing performed by a GS encoder according to the second embodiment.

FIG. 35 is a schematic for illustrating a processing performed by the GS encoder 210 according to the second embodiment. In the encoding processing, the GS encoder 210 first inserts overhead bit "00" to an input string (step S201), and then performs a first scramble (step S202).

Figure 36:
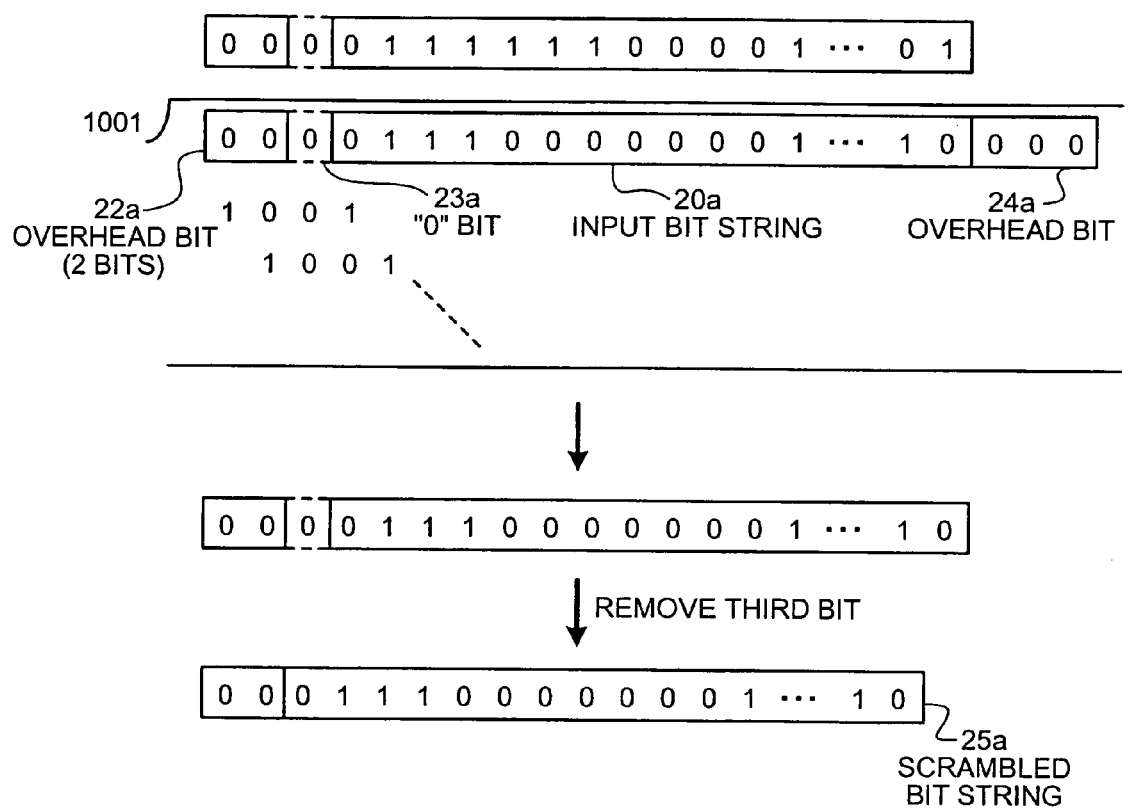
FIG. 36 is a schematic for illustrating a first scramble performed by the GS encoder according to the second embodiment.

FIG. 36 is a schematic for illustrating a first scramble performed by the GS encoder 210 according to the second embodiment. For generating a scrambled-bit string, $1+X^3$ is used as a scramble polynomial.

The GS encoder 210 adds 2-bit overhead bit 22a and "0" bit 23a in front of an input string 20a. The GS encoder 210 also adds 3-bit overhead bit 24a "000" behind the input string 20a.

The GS encoder 210 then divides the bit string by "1001" indicating $1+X^3$, to calculate a bit string as a quotient. Thereafter, the GS encoder 210 removes the third bit from the head of the bit string in the quotient to obtain a scrambled string 25a. In the first embodiment, the scramble processing is performed on each type of 3-bit overhead bits ("000", "001", "010", "011", "100", "101", "110", and "111"), but in the second embodiment, the scramble processing is performed on only the overhead bit "00".

Instead, the GS encoder 210 according to the second embodiment performs the scramble processing on the remaining types of the overhead bits ("01", "10" and "11") using a simplified second scramble, to be explained in detail later.

Referring back to FIG. 35, the GS encoder 210 performs the CSDS calculation on the single scrambled-bit string with respect to the overhead bit "00" (step S203).

Figure 37:
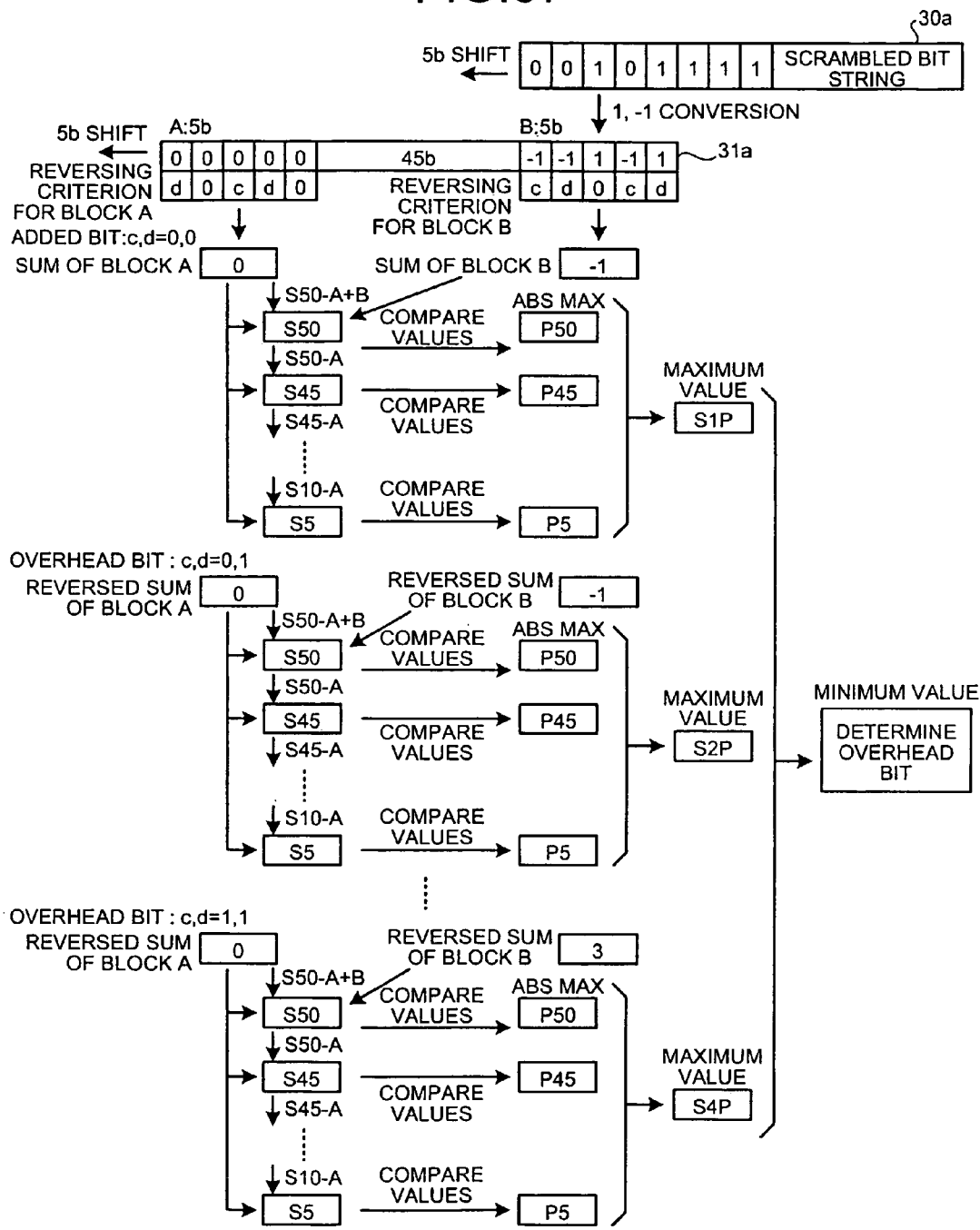
FIG. 37 is a schematic for illustrating a CSDS calculation.

FIG. 37 is a schematic for illustrating a CSDS calculation. As shown in FIG. 37, a first bit string on the top is a scrambled-bit string 30a with the overhead bit "00". A second bit string 31a from the top having a 55-bit width corresponds to a 50-bit SDS window. A first 5-bit block of the bit string 31a, from bit 1 to bit 5, is designated as Block A while a last 5-bit block of the bit string 31a, from bit 51 to bit 55, is designated as Block B.

The Block A and the following 45 bits of the bit string 31a are assigned with "0" as an initial value. The Block B of the bit string 31a is assigned with bit 1 to bit 5 of the scrambled-bit string 30a converted with a "1, −1 conversion". In other words, the value "1" and the value "0" in the first five bit of the scrambled-bit string 30a are converted to "1" and "−1", respectively, and then are assigned to the Block B of the bit string 31a. In FIG. 37, the Block B of the bit string 31a is assigned with "−1, −1, −1, −1, −1". The scrambled-bit string 30a is shifted to the left by five bits one after another, and each of the values in the bit string 31a is updated in accordance to the corresponding value in the shifted scrambled-bit string 30a.

Values S50, S45, . . . , and S5 are assigned with RDS values of bit 1 through to bit 50, bit 1 through bit 45, . . . , and bit 1 through 5 of a SDS window (the bit string 31a), respectively. The values S50, S45, . . . , and S5 are initialized to "0".

Values P50, P45, . . . , and P5 are assigned with peak values of bit 1 through to bit 50, bit 1 through bit 45, . . . , and bit 1 through 5 of the SDS window, respectively. The values P50, P45, . . . , and P5 are initialized to "0".

A sum of the Block A and a sum of the Block B of the bit string 31a are calculated. As shown in FIG. 37, the sum of the Block A is "0" and the sum of the Block B is "−1". RDS values of S5, S10, S15, . . . , S45, and S50 are updated using the Block A and the Block B. Each of the RDS values of S5 to S50 are calculated with formulae S5=S10−A, S10=S15−A, S15=S20−A, . . . , S45=S50−A, and S50=S50−A+B, respectively.

The RDS peak values P5 to P50 are calculated by comparing absolute values of the updated RDS values S5 to S50 with the RDS peak values P5 to P50 with a following equation.

$$Pi=\max[|Si|,Pi] \ (i=5, 10, 15, \ldots, 50)$$

If, for example, an absolute value of S5 is larger than a value of P5, the value of P5 is updated to the absolute value of S5.

Thereafter, the scrambled-bit string 30a and the bit string 31a are shifted by 5 bits to the left one after another, the values S5 to S50 are calculated, and the values P5 to P50 are updated successively. When all the shifting processes with respect to the scrambled-bit string 30a are completed, a peak value S1P of the scrambled-bit string 30a with respect to the overhead bit "00" is calculated with a following equation.

$$S1P=\max[Pi] \ (i=5, 10, 15, \ldots, 50)$$

The CSDS calculation with respect to the overhead bit other than "00" is explained next. The CSDS calculation with respect to the overhead bit "11" is explained. In performing the CSDS calculation with respect to the overhead bit other than "00", a "reversing criterion for the Block A" and a "reversing criterion for the Block B" are used. By using the "reversing criterion for the Block A" and the "reversing criterion for the Block B", the peak values for the RDS values with respect to the overhead bits "01", "10", and "11" can be calculated without performing the scramble processing with respect to the overhead bits "01", "10", and "11" in step S202 in FIG. 35.

Figures 38, 39:
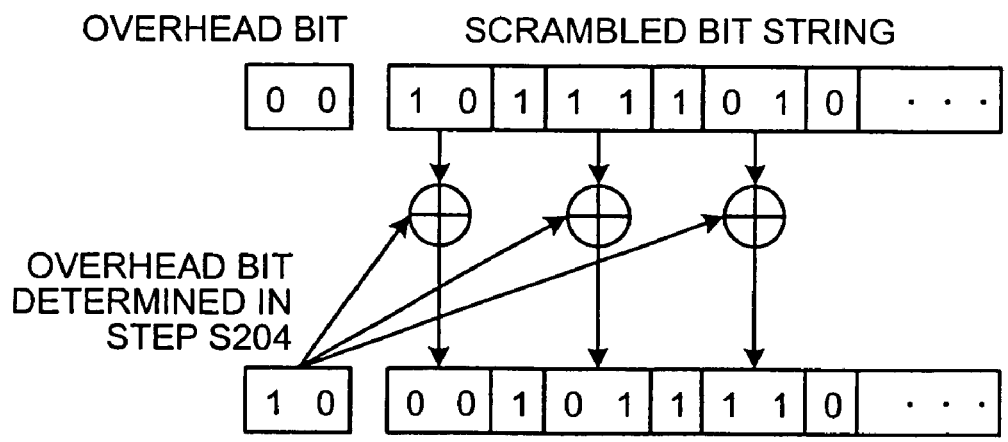
FIG. 38 is a table of a relationship between a reversing criterion for Block A, a reversing criterion for Block B, and a number of shifts applied to a scrambled-bit string.
FIG. 39 is a schematic for illustrating a second scramble performed by the GS encoder according to the second embodiment.

The "reversing criterion for the Block A" is a criterion for reversing the Block A of the bit string 31a, while the "reversing criterion for the Block B" is a criterion for reversing the Block B of the bit string 31a. As shown in FIG. 38, the reversing criterion for the Block A and the reversing criterion for the Block B are altered based on the number of shifts applied to the scrambled-bit string 30a. FIG. 38 is a table of relationship between the reversing criterion for the Block A, the reversing criterion for the Block B, and the number of shifts applied to the scrambled-bit string 30a. As shown in FIG. 38, if the number of shifts applied to the scrambled-bit string 30a is zero, namely at the initial state, the reversing criterion for the Block A is "d0cd0" and the reversing criterion for the Block B is "cd0cd".

The "c" and "d" with respect to the reversing criterion for the Block A and the reversing criterion for the Block B are assigned with values corresponding to the overhead bit. If the overhead bit is "11", then "c" is assigned with "1" and "d" is assigned with "1". If the overhead bit is "01", "c" is assigned with "0" and "d" is assigned with "1". Similarly, if the overhead bit is "10", "c" is assigned with "1" and "d" is assigned with "0".

Accordingly, if the overhead bit is "11" and the number of shifts is zero, the reversing criterion for the Block A is "10110" and the reversing criterion for the Block B is "11011". And if a bit in the reversing criterion for the Block A or in the reversing criterion for the Block B is "1", then a corresponding bit in the Block A or in the Block B, respectively, is reversed from "1" to "−1". If the bit in the reversing criteria is "0", no operation is performed on the corresponding bit. Specifically, the Block A in the bit string 31a will be "00000" owing to the reversing criterion for the Block A, and the Block B in the bit string 31a will be "1111-1" owing to the reversing criterion for the Block B.

A sum (a reversed sum) of the Block A and a sum (a reversed sum) of the Block B of the bit string 31a are calculated with the bits in the Block A and Block B reversed according to the reversing criteria. In FIG. 37, the reversed sum of the Block A with respect to the overhead bit "11" is "0" and the reversed sum of the Block B is "3". The RDS values S5 to S50 and the peak values P5 to P50 are calculated in the same manner as is explained above with respect to the overhead bit "00", and their explanations are omitted.

The scrambled-bit string 30a and the bit string 31a with respect to the overhead bit "11" are also shifted by five bits one after another, the reversed sum of the Block A and the reversed sum of the Block B are calculated, and the RDS values S5 to S50 and the peak values P5 to P50 with respect to the overhead bit "11" are updated. (Note that as shown in FIG. 38, the reversing criteria change according to the number of shifts with a 3-shift cycle.) The peak value S4P of the scrambled-bit string 30a with respect to the overhead bit "11" is calculated thereafter. The calculation method is the same with the peak value S1P and its explanations are omitted. Similarly, a peak value S2P with regard to the overhead bit "01" and a peak value S3P with regard to the overhead bit "10" can be calculated with the same method as the peak value S4P, and their explanations are omitted.

Referring back to FIG. 35, the GS encoder 210 searches for the smallest peak value from the peak values S1P to S4P of the scrambled-bit string to determine the overhead bit (step S204). If, for example, the peak value S1P is the smallest, the overhead bit will be "00". If, however, the peak value S2P is the smallest, the overhead bit will be "01". If the peak value S3P is the smallest, the overhead bit will be "10", and if the peak value S4P is the smallest, the overhead bit will be "11".

The GS encoder, after determining the overhead bit, performs a second scramble using the determined overhead bit and the scrambled-bit string scrambled in step S202 (step S205).

FIG. 39 is a schematic for illustrating a second scramble performed by the GS encoder 210 according to the second embodiment. The rescrambling is performed on the EOR of the scrambled-bit string with respect to the overhead bit "00" and the overhead bit determined in step S204.

Specifically, if the overhead bit is determined to be "10" in step S204, bit 3 and bit 4, bit 6 and bit 7, bit 9 and bit 10, and so on, are EOR operated with the overhead bit "10", to obtain a scrambled-bit string with respect to the overhead bit "10". The GS encoder 210 outputs the calculated scrambled-bit string to the HR-RLL encoder 105.

Because the GS encoder 210 can calculate the scrambled-bit string with respect to the overhead bits "01", "10", and "11" with the simplified method, it is not necessary to calculate the scrambled-bit strings with respect to the overhead bits in advance. Accordingly, the calculation amount with respect to the scramble processing can be reduced substantially, thereby enabling to reduce the circuit size of the encoder.

Figures 40, 41:
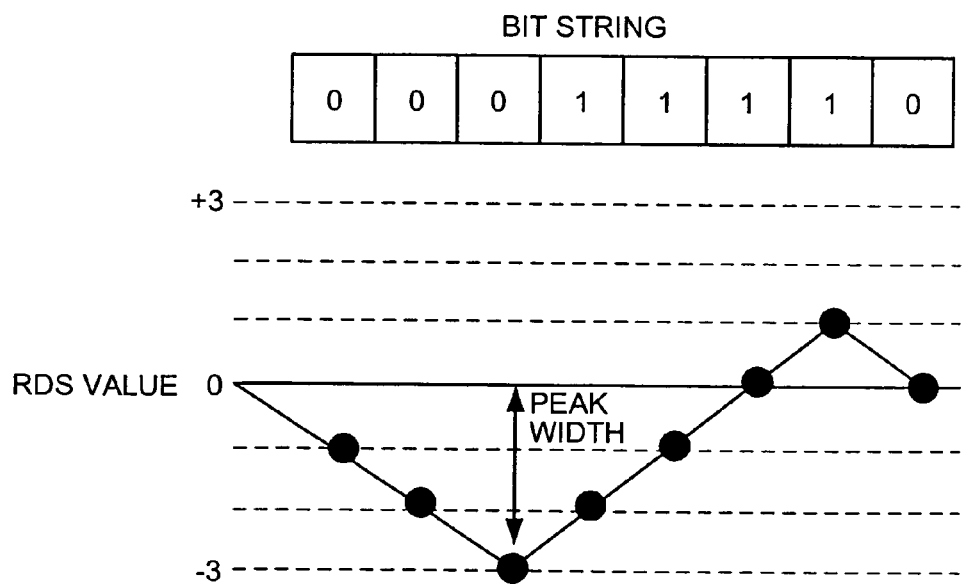
FIG. 40 is a schematic for illustrating a descramble processing for descrambling a scrambled-bit string encoded by the GS encoder according to the second embodiment.
FIG. 41 is a schematic for illustrating an evaluation method of evaluating suppressed amount of DC components.

FIG. 40 is a schematic for illustrating a descramble processing for descrambling a scrambled-bit string encoded by the GS encoder 210 according to the second embodiment.

In the descramble processing, "0" bit is inserted in the input string behind the 2-bit overhead bit. The scramble polynomial $1+X^3$ is then multiplied to the input string in which "0" bit is inserted.

Specifically, this calculation can be executed, as shown in FIG. 40, by preparing two input strings in which "0" bit is inserted in the third bit from the head of the bit string, shifting one of the input strings by 3 bits and adding these two input strings. The GS decoder 124 outputs the obtained result as an output example of the descramble processing.

According to the second embodiment, the GS encoder 210 generates a single encoded bit string by scrambling with respect to the input string, selects a bit string having a predetermined width in the generated bit string, while shifting the bits by, for instance, five bits one after another, to evaluate the DC components in the selected respective bit strings, determine the overhead bit based on the evaluation result, rescrambles the bit string using the determined overhead bit, and extracts the bit string with suppressed DC-components. Accordingly, even when the code rate is high, the DC components can be effectively suppressed to improve the error rate.

Furthermore, according to the second embodiment, the scrambling is performed on an EOR of the bit overhead based on the result of the DC component evaluation and a scrambled-bit string, to output the bit string with suppressed DC components. Accordingly, because it is necessary to scramble only the required bit string with a simple EOR calculation and not all the bit strings in advance, processing with respect to the scrambling can be reduced substantially.

Moreover, according the second embodiment, the CSDS window is shifted by 5 bits one after another, thereby simplifying the RDS calculations, while keeping the level of performance equivalent to that of the GS encoder according to the first embodiment. Accordingly, it is possible to manufacture at a low cost the recording and reproducing apparatus equivalent in performance to the recording and reproducing apparatus according to the first embodiment.

While the present embodiments of the present invention have been explained above, the invention can be executed in various embodiments other than the first and the second embodiments, within the technical scope of the appended claims.

For example, while according to the present embodiments, the HR-RLL encoder performs RLL encoding, the present invention is not limited thereto, and after the GS encoder 104 performs scramble processing for the bit string, RLL encoding can be performed for all scrambled strings, as in the conventional guided scrambling method, and thereafter, the scrambled-bit string with suppressed DC-components can be extracted by SDS calculation.

In this case, the number of the RLL encoders increases to increase the circuit size, but even when the code rate is high, the DC components can be effectively suppressed, thereby enabling improvement in the error rate.

Furthermore, a circuit for detecting the frequency characteristics of the output bit string of the GS encoder 104 can be provided. Accordingly, the degree of suppression of the DC components can be easily checked, and the encoding effect can be confirmed.

Of the respective processing explained according to the present embodiment, all or a part of the processing explained as being performed automatically may be performed manually, or all or a part of the processing explained as being performed manually may be performed automatically in a known method.

The information including the processing procedure, the control procedure, specific names, and various kinds of data and parameters shown in the specification or in the drawings can be optionally changed, unless otherwise specified.

The respective constituents of the illustrated apparatus are functionally conceptual, and the physically same configuration is not always necessary.

In other words, the specific mode of dispersion and integration of the apparatus is not limited to the illustrated one, and all or a part thereof may be functionally or physically dispersed or integrated in an optional unit, according to the various kinds of load and the status of use.

Furthermore, all or an optional part of the various processing functions performed by the apparatus can be realized by the CPU or a program analyzed and executed by the CPU, or can be realized as hardware by the wired logic.

The encoding method or the decoding method explained according to the present embodiments can be realized by executing a prepared program by a computer. This program can be recorded on a storage unit such as a ROM, read from the storage unit and executed.

According to the present invention, even when the code rate is high, the DC components can be effectively suppressed to improve the error rate. In addition, after only a bit string with suppressed DC-component is extracted from the scrambled-bit strings, the bit string is encoded by HR-RLL encoder. Accordingly, it is not necessary to perform encoding for all scrambled-bit strings, as in the conventional guided scrambling method, thereby enabling a reduction of the circuit size.

Furthermore, according to the present invention, when the method is combined with base line correction, an error rate can be decreased even with a high code rate by efficiently suppressing the DC components. In addition, because only those bit strings with suppressed DC components are first extracted from among the scrambled-bit strings and are thereafter subjected to RLL encoding, it is not necessary to perform the RLL encoding on all the scrambled-bit strings, as in the conventional guided scrambling method, thereby enabling a reduction of the circuit size.

Moreover, according to the present invention, the number of scrambled-bit strings can be reduced to half, and code rate can be also increased.

Furthermore, according to the present invention, the DC components in the bit strings can be evaluated in the same state as that of the bit string when stored in the memory unit or the like.

Moreover, according to the present invention, by outputting the bit strings in the state without having the parity bit, encoding of the bit strings can be performed without affecting another encoder added with the parity bit.

Furthermore, according to the present invention, by using the RDS value, effective evaluation of the DC component can be performed.

Moreover, according to the present invention, encoding can be performed for all scrambled-bit strings, as in the conventional guided scrambling method, and even when the code rate is high, the DC components can be effectively suppressed, to improve the error rate.

Furthermore, according to the present invention, since it is not necessary to perform RLL encoding for all scrambled-bit strings, as in the conventional guided scrambling method, the circuit size can be reduced.

Moreover, according to the present invention, when the condition of constraint is satisfied, the bit string can be output in the DC-component suppressed state.

Furthermore, according to the present invention, by reducing the value of constraint condition, error propagation in the bit string can be suppressed, thereby facilitating synchronization at the time of decoding the bit string.

Moreover, according to the present invention, error propagation in the bit string can be further suppressed.

Furthermore, according to the present invention, it is easily determined whether the bit string violates the condition of constraint, and when the bit string does not violate the condition of constraint, the bit string can be output in the DC-component suppressed state.

Moreover, according to the present invention, by performing the above processing for the bit string with suppressed DC-component, when the bit string does not violate the condition of constraint, the bit string can be output in the DC-component suppressed state.

Furthermore, according to the present invention, since the frequency characteristics of the bit string with suppressed DC-component is detected, the degree of suppression of the DC components can be easily checked.

Moreover, according to the present invention, a processing with respect to calculation of RDS values and evaluation of the DC components can be simplified.

Furthermore, according to the present invention, the DC components of a plurality of the bit strings can be evaluated by generating a single scrambled-bit string, without generating each of the bit strings for the evaluation of the DC components.

Moreover, according to the present invention, because it is necessary only to scramble a required bit string and not all the bit strings in advance, a processing with respect to scrambling can be reduced substantially.

Furthermore, according to the present invention, a scramble is performed with an EOR of a bit overhead identified based on a result of a DC-component evaluation and a scrambled-bit string, and a bit string with suppressed DC components is outputted. Accordingly, because it is necessary to scramble only required bit strings with a simple EOR calculation and not all the bit strings in advance, processing with respect to scrambling can be reduced substantially.

Moreover, according to the present invention, since the bit strings encoded by the encoder are decoded, the encoded bit strings with suppressed DC-component can be decoded.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. An encoder comprising:
an encoded-bit-string generating unit that generates a plurality of first bit strings encoded by scrambling an input bit string;
a direct-current-component evaluating unit that selects second bit strings having a predetermined width in each of the first bit strings, while shifting the position of each of the second bit strings by p-bit(s), where p is a positive integer, and evaluates the direct-current component in each of the second bit strings; and
a bit-string extracting unit that extracts a third bit string with a locally suppressed direct-current component from among the first bit strings, based on a result of an evaluation by the direct-current-component evaluating unit.

2. The encoder according to claim 1, wherein
the direct-current-component evaluating unit selects the second bit strings in each of the first bit strings, while shifting the position of each of the second bit strings by one bit, and evaluates the direct-current component in each of the second bit strings.

3. The encoder according to claim 2, wherein
the scrambling is performed by adding n-bits of different bit strings and a specific q-bits to the input bit string, where n and q are positive integers, and
the bit-string extracting unit removes the specific q-bits from the third bit string.

4. The encoder according to claim 2, wherein
the bit-string extracting unit adds a parity bit to each of the first bit strings, and
the direct-current-component evaluating unit selects the second bit strings in each of the first bit strings with the parity bit added, and evaluates the direct-current component in each of the second bit strings with the parity bit added.

5. The encoder according to claim 4, wherein
the bit-string extracting unit removes the parity bit from the third bit string.

6. The encoder according to claim 2, wherein
the direct-current-component evaluating unit evaluates the direct-current component in each of the second bit strings, by calculating a running-digital-sum value for the second bit strings.

7. The encoder according to claim 1, wherein
the direct-current-component evaluating unit further performs a run-length-limited encoding of the first bit strings, and selects the second bit string in the first bit string that is run-length-limited encoded.

8. The encoder according to claim 1, further comprising:
a run-length-limited encoder that performs a run-length-limited encoding of the third bit string.

9. The encoder according to claim 8, wherein
the run-length-limited encoder outputs, when the third bit string satisfies a predetermined condition of constraint, the third bit string without performing the run-length-limited encoding.

10. The encoder according to claim 9, wherein
the run-length-limited encoder performs the run-length-limited encoding of the third bit string to dissolve a violation against the predetermined condition of constraint.

11. The encoder according to claim 10, wherein
the run-length-limited encoder performs the run-length-limited encoding of the third bit string to further dissolve a violation against the condition of constraint, for every predetermined number of bits in the third bit string.

12. The encoder according to claim 9, wherein
the run-length-limited encoder adds "1" bit to the third bit string when the third bit string violates the condition of constraint, and adds "0" bit to the third bit string otherwise.

13. The encoder according to claim 9, wherein
the run-length-limited encoder performs a non-return-to-zero encoding and a non-return-to-zero decoding of the third bit string.

14. The encoder according to claim 1, further comprising:
a frequency-characteristic detecting unit that detects a frequency characteristic of the third bit string.

15. The encoder according to claim 1, wherein
the direct-current-component evaluating unit selects the second bit strings, while shifting the position of each of the second bit strings by p-bit(s), where p is a positive integer, and evaluates the direct-current component in the second bit strings by calculating a running-digital-sum value for each of the second bit strings.

16. The encoder according to claim 15, wherein
the direct-current-component evaluating unit calculates the running-digital-sum value for a plurality of bit strings by reversing bits in a predetermined width in the first bit string based on different conditions according to a number of shifts and an added bit, and evaluates the direct-current component in the bit strings.

17. The encoder according to claim 1, wherein
the bit-string extracting unit performs a scrambling based on the result of the evaluation by the direct-current-component evaluating unit, and outputs the third bit string with suppressed direct-current component.

18. The encoder according to claim 17, wherein
the scrambling is performed by performing an exclusive-OR of the n-bit bit string determined based on the result of the evaluation by the direct-current-component evaluating unit and the first bit string, where n is a positive integer.

19. The encoder according to claim 1, wherein
the scrambling is performed by adding n-bits of different bit strings and a specific q-bits to the input bit string, where n and q are positive integers, and
the bit-string extracting unit removes the specific q-bits from the third bit string.

20. A decoder comprising:
a decoding unit that decodes a bit string encoded by an encoder that includes
an encoded-bit-string generating unit that generates a plurality of bit strings encoded by scrambling an input bit string;
a direct-current-component evaluating unit that selects bit strings having a predetermined width in each of the bit strings generated by the encoded-bit-string generating unit, while shifting the position of each of the bit strings to selected by p-bit(s), where p is a positive integer, and evaluates the direct-current component in each of the selected bit strings; and
a bit-string extracting unit that extracts a bit string with a locally suppressed direct-current component from among the bit strings generated by the encoded-bit-string generating unit, based on a result of an evaluation by the direct-current-component evaluating unit.

21. A method of encoding a bit string, the method comprising:
generating a plurality of bit strings encoded by scrambling an input bit string;
selecting bit strings having a predetermined width in each of the bit strings generated at the generating step, while shifting the position of each of the bit strings to be selected by p-bit(s), where p is a positive integer;
evaluating the direct-current component in each of the selected bit strings; and
extracting a bit string with a locally suppressed direct-current component from among the bit strings generated by the encoded-bit-string generating unit, based on a result of an evaluation at the evaluating step.

* * * * *